(12) United States Patent
Kim et al.

(10) Patent No.: US 9,496,266 B2
(45) Date of Patent: Nov. 15, 2016

(54) SEMICONDUCTOR DEVICE INCLUDING A CAPACITOR AND A METHOD OF MANUFACTURING THE SAME

(71) Applicant: SAMSUNG ELECTRONICS CO., LTD., Suwon-si, Gyeonggi-do (KR)

(72) Inventors: Kyung-Eun Kim, Seoul (KR); Young-Seung Cho, Yongin-si (KR); So-Hyun Park, Seoul (KR); Sang-Jo Yun, Suwon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/595,834

(22) Filed: Jan. 13, 2015

(65) Prior Publication Data
US 2016/0020212 A1    Jan. 21, 2016

(30) Foreign Application Priority Data

Jul. 18, 2014 (KR) .................... 10-2014-0090893

(51) Int. Cl.
*H01L 27/108* (2006.01)
*H01L 49/02* (2006.01)

(52) U.S. Cl.
CPC ... *H01L 27/10814* (2013.01); *H01L 27/10852* (2013.01); *H01L 28/60* (2013.01); *H01L 28/90* (2013.01); *H01L 27/10823* (2013.01); *H01L 27/10876* (2013.01)

(58) Field of Classification Search
CPC .................. H01L 21/70; H01L 21/702; H01L 21/8232; H01L 21/8239; H01L 29/66007
See application file for complete search history.

(56) References Cited

U.S. PATENT DOCUMENTS

| | | | |
|---|---|---|---|
| 7,727,837 B2 | 6/2010 | Gruening-Von Schwerin et al. |
| 8,003,480 B2 | 8/2011 | Huang et al. |
| 8,088,668 B2 | 1/2012 | Huang et al. |
| 8,114,733 B2 | 2/2012 | Kim et al. |
| 8,404,555 B2 | 3/2013 | Wang |
| 8,574,929 B1 | 11/2013 | Or-Bach et al. |
| 8,679,935 B2 | 3/2014 | Lee et al. |
| 8,753,954 B2 | 6/2014 | Park |
| 8,766,343 B2 | 7/2014 | Kang et al. |

(Continued)

FOREIGN PATENT DOCUMENTS

| | | |
|---|---|---|
| JP | 2010-087117 | 4/2010 |
| JP | 2013-197281 | 9/2013 |

(Continued)

*Primary Examiner* — Cheung Lee
(74) *Attorney, Agent, or Firm* — F. Chau & Associates, LLC

(57) ABSTRACT

A method of manufacturing a semiconductor device is provided. The method includes sequentially forming a mold layer and a preliminary support layer on a substrate, forming a plurality of lower electrodes through the preliminary support layer and the mold layer, removing a portion of the preliminary support layer between the plurality of lower electrodes to form a preliminary support layer pattern having an open area exposing a top surface of the mold layer, removing the mold layer to form a void between the substrate and the preliminary support layer pattern, filling the open area and the void with a sacrificial layer, and replacing the preliminary support layer pattern with a support pattern.

19 Claims, 31 Drawing Sheets

(56) References Cited

U.S. PATENT DOCUMENTS

| | | |
|---|---|---|
| 2010/0078697 A1 | 4/2010 | Sugino |
| 2012/0015494 A1 | 1/2012 | Kobayashi et al. |
| 2013/0147048 A1 | 6/2013 | Kuh et al. |
| 2013/0228837 A1 | 9/2013 | Sukekawa et al. |
| 2013/0292796 A1 | 11/2013 | Cho et al. |
| 2013/0299942 A1 | 11/2013 | Park et al. |
| 2013/0328168 A1 | 12/2013 | Malhotra et al. |

FOREIGN PATENT DOCUMENTS

| | | |
|---|---|---|
| KR | 1020090043325 | 5/2009 |
| KR | 1020090105089 | 10/2009 |
| KR | 1020090114144 | 11/2009 |
| KR | 1020110082901 | 7/2011 |
| KR | 1020110088154 | 8/2011 |
| KR | 1020120102386 | 9/2012 |
| KR | 1020130063875 | 6/2013 |

SEMICONDUCTOR DEVICE INCLUDING A CAPACITOR AND A METHOD OF MANUFACTURING THE SAME

CROSS-REFERENCE TO RELATED APPLICATION

This application claims priority under 35 U.S.C. §119 to Korean Patent Application No. 10-2014-0090893, filed on Jul. 18, 2014, in the Korean Intellectual Property Office (KIPO), the disclosure of which is incorporated by reference herein in its entirety.

TECHNICAL FIELD

Exemplary embodiments of the present inventive concept relate to a semiconductor device and a method of manufacturing the same, and more particularly to, a semiconductor device including a capacitor and a method of manufacturing the same.

DISCUSSION OF THE RELATED ART

In a semiconductor device, e.g., a dynamic random access memory (DRAM) device, an area of each element may decrease as an integration degree of the semiconductor device increases, while a required capacitance of a capacitor in the semiconductor device increases or stays the same. Thus, a lower electrode of the capacitor may have a three-dimensional shape, the capacitor may have an increased height, or the lower electrode may have a cylindrical or pillar shape.

SUMMARY

Exemplary embodiments of the present inventive concept provide a method of manufacturing a semiconductor device having an enhanced reliability.

Exemplary embodiments of the present inventive concept provide a semiconductor device having an enhanced reliability.

According to an exemplary embodiment of the present inventive concept, there is provided a method of manufacturing a semiconductor device. In the method, a mold layer and a preliminary support layer are sequentially formed on a substrate. A plurality of lower electrodes is formed through the preliminary support layer and the mold layer. A portion of the preliminary support layer between the plurality of lower electrodes is removed to form a preliminary support layer pattern having an open area exposing a top surface of the mold layer. The mold layer is removed to form a void between the substrate and the preliminary support layer pattern. The open area and the void are filled with a sacrificial layer. The preliminary support layer pattern is replaced with a support pattern.

In an exemplary embodiment, when the preliminary support layer pattern is replaced with the support pattern, the preliminary support layer pattern may be removed to expose a top surface of the sacrificial layer, a support layer may be formed on the exposed top surface of the sacrificial layer, and the support layer may be planarized until a top surface of the lower electrode may be exposed to form the support pattern on the exposed top surface of the sacrificial layer.

In an exemplary embodiment, the sacrificial layer may be removed to expose the plurality of lower electrodes, and a dielectric layer and an upper electrode may be sequentially formed on the plurality of lower electrodes.

In an exemplary embodiment, top surfaces of the lower electrodes may be formed to be substantially coplanar with a top surface of the support pattern.

In an exemplary embodiment, the support pattern may include a first material different from that of the preliminary support layer pattern, and the first material may include an oxide.

In an exemplary embodiment, the mold layer may include a semiconductor oxide, polysilicon, amorphous silicon, silicon-germanium or a combination thereof, and the sacrificial layer may include spin on hardmask (SOH) and/or polysilicon.

In an exemplary embodiment, each of the plurality of lower electrodes may be formed to have a cylindrical shape and/or a pillar shape.

In an exemplary embodiment, when the preliminary support layer pattern are replaced with the support pattern, the preliminary support layer pattern may be removed to expose a portion of the sacrificial layer, the exposed portion of the sacrificial layer may be partially removed to form a recess, and a first support pattern, an additional sacrificial layer, and a second support pattern may be sequentially formed in the recess.

In an exemplary embodiment, the first support pattern may include an oxide and/or a nitride, and the second support pattern may include an oxide.

In an exemplary embodiment, an additional mold layer and an additional preliminary support layer may be formed on the support pattern and the sacrificial layer. A plurality of additional lower electrodes may be formed through the, additional preliminary support layer and the additional mold layer to contact the plurality of lower electrodes, respectively. A portion of the additional preliminary support layer between the plurality of additional lower electrodes may be removed to form an additional preliminary support layer pattern having an additional open area exposing a top surface of the additional mold layer. The additional mold layer may be removed to form an additional void between the support pattern and the additional preliminary support layer pattern. The additional open area and the additional void may be filled with an additional sacrificial layer. The additional preliminary support layer pattern may be replaced with an additional support pattern. The sacrificial layer and the additional sacrificial layer may be removed to expose the plurality of lower electrodes and the plurality of additional lower electrodes. A dielectric layer and an upper electrode may be sequentially formed on the plurality of lower electrodes and the plurality of additional lower electrodes.

In an exemplary embodiment, each of the plurality of lower electrodes may be formed to have a cylindrical shape or a pillar shape, and each of the plurality of additional lower electrodes may be formed to have a cylindrical shape or a pillar shape.

In an exemplary embodiment, the support pattern may include an oxide and/or a nitride, and the additional support pattern may include a first material different from that of the preliminary support layer pattern, and the first material may include an oxide.

In an exemplary embodiment, top surfaces of the additional lower electrodes may be formed to be substantially coplanar with a top surface of the additional support pattern.

In an exemplary embodiment, the additional mold layer may include a semiconductor oxide, polysilicon, amorphous silicon, silicon-germanium or a combination thereof, and the additional sacrificial layer may include spin on hardmask (SOH) and/or polysilicon.

In an exemplary embodiment, an additional support pattern may be further formed between the substrate and the support pattern.

In an exemplary embodiment, the support pattern may include an oxide, and the additional support pattern may include an oxide and/or a nitride. Top surfaces of the lower electrodes may be formed to be substantially coplanar with a top surface of the support pattern.

According to an exemplary embodiment of the present inventive concept, there is provided a method of manufacturing a semiconductor device. In the method, a plurality of lower electrodes is formed through a mold layer and a support layer sequentially formed on a substrate. A portion of the support layer between the plurality of lower electrodes is removed to form a support pattern having an open area exposing at least partially a top surface of the mold layer. The mold layer is removed to expose the plurality of lower electrodes. A dielectric layer and an upper electrode are sequentially formed on the plurality of lower electrodes. The mold layer includes spin on hardmask (SOH), the support pattern includes an oxide, and the lower electrodes include polysilicon.

In an exemplary embodiment, an additional support pattern may be further formed between the substrate and the support pattern.

In an exemplary embodiment, the support pattern may include an oxide, and the additional support pattern may include an oxide and/or a nitride.

In an exemplary embodiment, each of the lower electrodes may have a cylindrical shape, a pillar shape, or a combination thereof.

According to an exemplary embodiment of the present inventive concept, there is provided a semiconductor device. The semiconductor device includes a plurality of electrode structures, each of which extends in a first direction substantially perpendicular to a top surface of a substrate, and a support pattern structure including one or a plurality of support patterns disposed at a plurality of levels, respectively, between the plurality of electrode structures. The support pattern structure contacts at least a portion of each of the electrode structures. A farthest one of the support patterns from the top surface of the substrate includes an oxide, and has a top surface substantially coplanar with those of the electrode structures.

In an exemplary embodiment, each of the plurality of electrode structures may have a cylindrical shape, a pillar shape, or a combination shape thereof.

In an exemplary embodiment, the support pattern structure may include first and second support patterns at first and second distances, respectively, from the top surface of the substrate in the first direction. The second distance may be greater than the first distance. A length of a portion of the first support pattern neighboring electrode structures may be greater than that of a portion of the second support pattern neighboring electrode structures. A width of an upper portion of each of the electrode structures may be greater than that of a lower portion of each of the electrode structures.

In an exemplary embodiment, the plurality of electrode structures may include first and second electrode structures at third and fourth distances, respectively, from the top surface of the substrate in the first direction. The fourth distance may be greater than the third distance. The second electrode structure may contact at least partially a top surface of the first electrode structure. A top surface of the first support pattern may be substantially coplanar with that of the first electrode structure, and a top surface of the second support pattern may be substantially coplanar with that of the second electrode structure. The first electrode structure may have a pillar shape, and the second electrode structure may have a cylindrical shape.

According to an exemplary embodiment of the present inventive concept, the semiconductor device may have a capacitor support pattern including an oxide, which may have a compact structure of layer, and thus the leakage current characteristics may be enhanced. Accordingly, the capacitors may be formed at a reduced distance from each other, so that the capacitance of the capacitors may be increased.

According to an exemplary embodiment of the present inventive concept, a method of manufacturing a semiconductor device is provided. The method includes forming a plurality of electrode structures on a substrate. Each of the electrode structures extends in a first direction substantially perpendicular to a top surface of the substrate. The method further includes forming a support pattern structure between the plurality of electrode structures. The support pattern structure includes one or a plurality of support patterns disposed at a plurality of levels, respectively and the support pattern structure contacts at least a portion of each of the electrode structures. A farthest one of the support patterns from the top surface of the substrate includes an oxide and includes a top surface with substantially a same height as the electrode structures.

In an exemplary embodiment, each of the plurality of electrode structures may be formed to have a cylindrical shape, a pillar shape, or a combination shape of the cylindrical shape and the pillar shape.

In an exemplary embodiment, forming the support pattern structure may include forming first and second support patterns at first and second distances, respectively, from the top surface of the substrate in the first direction, the second distance being greater than the first distance. A length of a portion of the first support pattern between neighboring electrode structures of the electrode structures may be smaller than that of a portion of the second support pattern between the neighboring electrode structures of the electrode structures. A width of an upper portion of each of the electrode structures may be greater than that of a lower portion of each of the electrode structures.

In an exemplary embodiment, forming the plurality of electrode structures may include forming first and second electrode structures at third and fourth distances, respectively, from the top surface of the substrate in the first direction. The fourth distance may be greater than the third distance. The second electrode structure may contact at least a portion of a top surface of the first electrode structure. A top surface of the first support pattern may have substantially a same height as the first electrode structure. A top surface of the second support pattern may have substantially a same height as the second electrode structure. The first electrode structure may have a pillar shape, and the second electrode structure may have a cylindrical shape.

BRIEF DESCRIPTION OF THE DRAWINGS

Exemplary embodiments of the present inventive concept will be more clearly understood from the following detailed description taken in conjunction with the accompanying drawings.

DESCRIPTION OF EMBODIMENTS

Figure 1A:
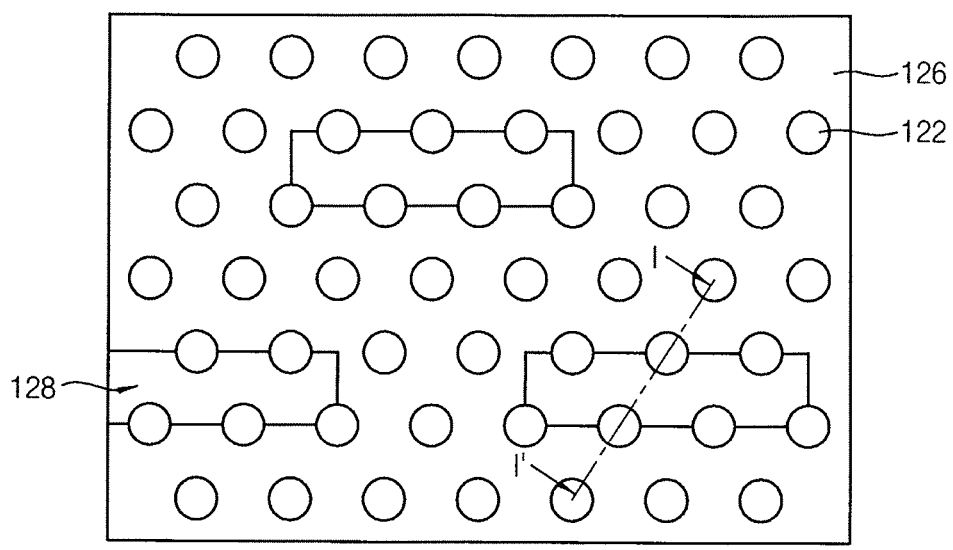
FIG. 1A is a plan view illustrating a layout of an electrode structure and a support pattern structure of a semiconductor device in accordance with an exemplary embodiment.

Various exemplary embodiments of the present inventive concept will be described more fully hereinafter with reference to the accompanying drawings, in which some exemplary embodiments are shown. The present inventive concept may, however, be embodied in many different forms and should not be construed as limited to the exemplary embodiments set forth herein. Rather, these exemplary embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals may refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the present inventive concept are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments of the present inventive concept should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
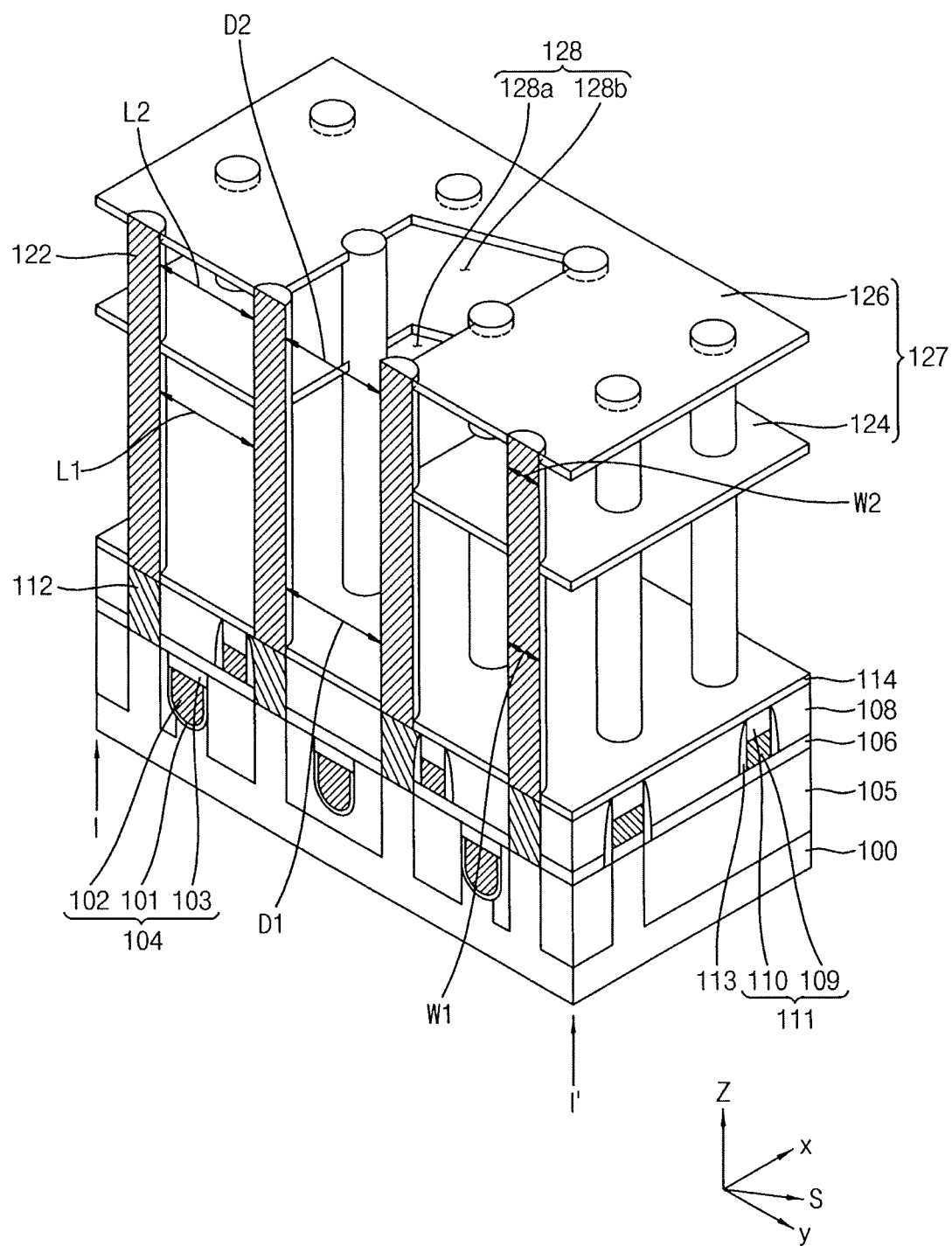
FIG. 1B is a schematic perspective view of the semiconductor device including a cross-section cut along a line I-I' of FIG. 1A.

FIG. 1A is a plan view illustrating a layout of an electrode structure and a support pattern structure of a semiconductor device in accordance with an exemplary embodiment, and FIG. 1B is a schematic perspective view of the semiconductor device including a cross-section cut along a line I-I' of FIG. 1A. For the convenience of explanation, some elements of the semiconductor device are not shown in FIG. 1B.

The semiconductor device according to an exemplary embodiment may be applied to a cell array region of a DRAM device, however, the present inventive concept is not limited thereto.

Referring to FIGS. 1A and 1B, the semiconductor device may include a gate structure 104 in a substrate 100, a bit line structure 111 on the substrate 100, an electrode structure 122, and a support pattern structure 127.

The substrate 100 may include a semiconductor material, e.g., silicon, germanium, silicon-germanium, etc., and may further include an epitaxial layer, a silicon-on-insulator (SOI), a germanium-on-insulator (GOI), a semiconductor-on-insulator (SeOI), etc. An isolation layer 105 defining an active region and a field region in the substrate 100 may be formed in the substrate 100.

The gate structure 104 may extend in a direction, e.g., an x-direction in the substrate 100. Thus, the gate structure 104 may cross the active region of the substrate 100 and the isolation layer 102. In an exemplary embodiment, a plurality of gate structures 104 may be formed in a y-direction substantially perpendicular to the x-direction.

In an exemplary embodiment, the gate structure 104 may be a buried word line forming a buried channel array transistor (BCAT). Thus, the gate structure 104 may include a gate electrode 102, a gate insulation layer pattern 101 surrounding a bottom and a sidewall of the gate electrode 102, and a capping layer pattern 103 covering top surfaces of the gate electrode 102 and the gate insulation layer pattern 101. A top surface of the capping layer pattern 103 may be substantially coplanar with a top surface of the substrate 100, and thus the top surface of the gate electrode 102, which may be formed under the capping layer pattern 103, may be lower than the top surface of the substrate 100. However, the present inventive concept is not limited thereto, and for example, the gate structure 104 may be a word line forming a planar transistor, and in this case, the word line may be formed on the substrate 100.

A cell blocking layer 106, an insulating interlayer 108, and an etch stop layer 114 may be sequentially stacked on the substrate 100 and the isolation layer 105.

The bit line structure 111 may extend in the insulating interlayer 108 along the y-direction substantially perpendicular to the x-direction in which the gate structure 104 may extend. Thus, the bit line structure 111 may be disposed on the active region of the substrate 100 and the isolation layer 102. In an exemplary embodiment, a plurality of bit line structures 111 may be formed in the x-direction. Alternatively, the bit line structure 111 may be a buried bit line that may be buried in the substrate 100, and in this case, the buried bit line may cross the active region of the substrate 100 and the isolation layer 102.

In an exemplary embodiment, the bit line structure 111 may include a bit line 109 and a mask 110 sequentially stacked, and a spacer 113 may be further formed on a sidewall of the bit line structure 111. The bit line structure 111 may be electrically connected to the active region of the substrate 100. A portion of the active region, which may be adjacent to a first side of the gate structure 104 and electrically connected to the bit line structure 111, may serve as a first source/drain region (not shown).

In an exemplary embodiment, a plurality of electrode structures 122 may be formed both in the x-direction and the y-direction. A plurality of electrode structures 122 may be also formed in an s-direction in which the line I-I' of FIG. 1A may extend. In an exemplary embodiment, when viewed from above, the gate structure 104 may be disposed between the electrode structures 122 adjacent to each other in the y-direction.

The electrode structure 122 may have a long and thin shape extending in a direction (e.g., a z-direction) substantially perpendicular to both of the x-direction and the y-direction. In an exemplary embodiment, the electrode structure 122 may have an aspect ratio, which may be a ratio of a height with respect to a width, in a range of about 10 to about 35.

In FIG. 1B, the electrode structure 122 has a pillar shape. However, the present inventive concept is not limited thereto, and for example, the electrode structure 122 may have other shapes, e.g., a hollow cylindrical shape. Alternatively, the electrode structure 122 may have a combination shape of a pillar shape and a hollow cylindrical shape. In this specification, the pillar shape may mean a solid cylindrical shape. The electrode structure 122 may include at least one of doped polysilicon, a metal, e.g., tungsten, titanium, ruthenium, etc., a metal oxide, e.g., ruthenium oxide, a metal nitride, e.g., titanium nitride, tungsten nitride, etc., and a combination thereof.

The electrode structure 122 may be electrically connected to a second source/drain region (not shown), which may be formed at a portion of the active region adjacent to a second side of the gate structure 104, via a contact pad 112. The contact pad 112 may penetrate through the insulating interlayer 108, and the electrode structure 122 may penetrate through the etch stop layer 114 to be electrically connected to the contact pad 112. In FIG. 1B, the electrode structure 122 is shown to be electrically connected to the substrate 100 via the contact pad 112. However, the present inventive concept is not limited thereto. For example, the electrode structure 122 may be electrically connected to the substrate 100 via at least one contact pad and/or at least one contact plug (not shown).

The number of the electrode structure 122 may be more or less than that shown in FIG. 1A. In an exemplary embodiment, the electrode structure 122 may serve as a lower electrode of a capacitor. However, the present inventive concept is not limited thereto, and the electrode structure 122 may be applied to any structure that may have a high aspect ratio and be disposed repeatedly in a direction.

The support pattern structure 127 may be disposed among the plurality of electrode structures 122, and may prevent the electrode structures 122 from being leaning or falling down. The support pattern structure 127 may partially contact sidewalls of the electrode structures 122 to support the electrode structures 122. In an exemplary embodiment, the support pattern structure 127 may have a flat plate shape substantially parallel to the top surface of the substrate 100 at a given height of the electrode structures 122.

The support pattern structure 127 may include an open area 128 therein. The open area 128 may be disposed repeatedly and/or regularly in the support pattern structure 127. In an exemplary embodiment, the open area 128 may have a rectangular shape when viewed from above. However, the present inventive concept is not limited thereto. Through the open area 128, a subsequent process may be performed on the electrode structure 122 that may be disposed under the support pattern structure 127. For example, when the electrode structure 122 is a lower electrode of a capacitor in a DRAM device, a dielectric layer 134 (refer to FIGS. 2A to 2E) and an upper electrode 136, 138, 140, or 142 (refer to FIGS. 2A to 2E) may be formed on the electrode structure 122.

In an exemplary embodiment, as shown in FIG. 1B, the support pattern structure 127 may include first and second support patterns 124 and 126 having the first and second open areas 128a and 128b, respectively, which may be also referred to as lower and upper support patterns 124 and 126, respectively, according to positions thereof. The upper support pattern 126 may contact an upper portion of the electrode structure 122, and the lower support pattern 124 may contact a lower portion of the electrode structure 122. In an exemplary embodiment, the lower support pattern 124 may contact a portion of the electrode structure 122 that may be located at a position higher than half of the total height of the electrode structure 122. Each of the lower and upper support patterns 124 and 126 may include at least one layer structure.

In an exemplary embodiment, the first and second open areas 128a and 128b may vertically overlap each other at least partially.

In an exemplary embodiment, a first width W1 of a lower portion of the electrode structure 122 may be smaller than a second width W2 of an upper portion of the electrode structure 122. For example, a first distance D1 between lower portions of neighboring electrode structures 122 may be greater than a second distance D2 between upper portions of neighboring electrode structures 122. Thus, a first length L1 of a portion of the lower support pattern 124 between the neighboring electrode structures 122 may be greater than a second length L2 of a portion of the upper support pattern 126 between the neighboring electrode structures 122.

An uppermost support pattern among the support pattern structure 127, e.g., the upper support pattern 126 may include an oxide, which may have a layer structure more compact than that of, e.g., a nitride, and thus may effectively prevent a leakage current between neighboring electrode structures 122. Thus, the distance between the neighboring electrode structures 122 may be reduced so that a width of each electrode structure 122 may be increased. For example, the first and second widths W1 and W2 of the electrode structure 122 may increase to enhance the capacitance of the capacitor of the semiconductor device.

FIGS. 2A, 2B, 2C, 2D, and 2E are cross-sectional views illustrating essential parts of a semiconductor device in accordance with an exemplary embodiment. Each of the cross-sectional views are cut along the line I-I' of FIG. 1A. The semiconductor device shown in FIGS. 2A, 2B, 2C, 2D and 2E may have elements substantially the same as those shown in FIGS. 1A and 1B. Thus, like reference numerals may refer to like elements, and detailed explanations thereon are omitted herein.

Figure 2A:
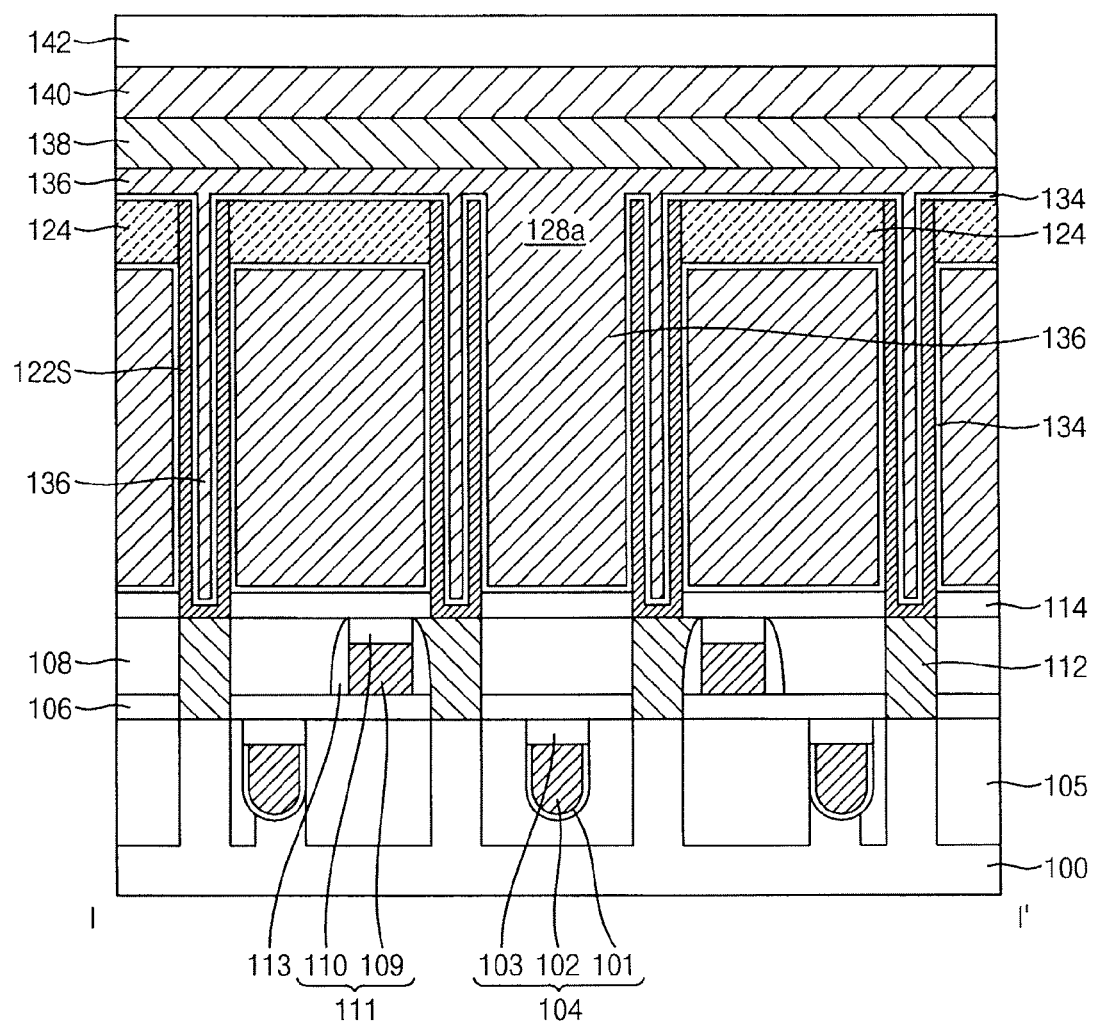
FIGS. 2A, 2B, 2C, 2D, and 2E are cross-sectional views illustrating essential parts of a semiconductor device in accordance with an exemplary embodiment.

Referring to FIG. 2A, the semiconductor device may include a gate structure 104 in a substrate 100, a bit line structure 111 on the substrate 100, a first electrode structure, and a first support pattern structure.

In an exemplary embodiment, a plurality of gate structures 104, a plurality of bit line structures 111, and a plurality of first electrode structures may be formed. Each of the gate structures 104 and each of the bit line structures 111 may extend in two directions, respectively, which may be substantially parallel to a top surface of the substrate 100 and substantially perpendicular to each other, and each of the first electrode structures may extend in a direction substantially perpendicular to the top surface of the substrate 100. The first support pattern structure may be disposed between neighboring first electrode structures and contact at least a portion of each first electrode structure.

An isolation layer 105 may be formed on the substrate 100 to define an active region and a field region therein.

A cell blocking layer 106, an insulating interlayer 108, and an etch stop layer 114 may be sequentially stacked on the substrate 100 and the isolation layer 105.

The insulating interlayer 108 may contain the bit line structure 111 therein, and the first electrode structure and the active region of the substrate 100 may be electrically connected to each other via a contact pad 112 penetrating through the insulating interlayer 108 and the cell blocking layer 106. The first electrode structure may penetrate through the etch stop layer 114 to contact the contact pad 112.

In an exemplary embodiment, the first electrode structure may include a cylindrical lower electrode 122S. In an exemplary embodiment, an upper width of the first electrode structure may be greater than a lower width thereof. Thus, a distance between lower portions of neighboring first electrode structures may be greater than a distance between upper portions of thereof. The first electrode structure may include at least one of doped polysilicon, a metal, e.g., tungsten, titanium, ruthenium, etc., a metal oxide, e.g., ruthenium oxide, a metal nitride, e.g., titanium nitride, tungsten nitride, etc., and a combination thereof.

In an exemplary embodiment, the first support pattern structure may include a first support pattern 124. A top surface of the first support pattern 124 may be substantially coplanar with a top surface of the first electrode structure. In an exemplary embodiment, the first support pattern 124 may include a first open area 128a therein, and may include an insulating material containing oxygen, e.g., silicon oxide and/or silicon oxynitride.

A dielectric layer 134 and an upper electrode structure may be sequentially formed on the first electrode structure. The dielectric layer 134 may include a high-k dielectric material, e.g., $ZrO_2$, $Al_2O_3$, $Hf_2O_3$, etc. The upper electrode structure may include at least one of doped polysilicon, a semiconductor material, e.g., silicon, germanium, silicon-germanium, etc., a metal, e.g., tungsten, titanium, ruthenium, etc., a metal oxide, e.g., ruthenium oxide, a metal nitride, e.g., titanium nitride, tungsten nitride, etc., and a combination thereof. In an exemplary embodiment, the upper electrode structure may include a plurality of layers sequentially stacked. In an exemplary embodiment, the upper electrode structure may include a first upper electrode 136, a second upper electrode 138, and a third upper electrode 140 sequentially stacked. The first upper electrode 136 may include, e.g., titanium nitride, the second upper electrode 138 may include, e.g., silicon-germanium, and the third upper electrode 140 may include, e.g., tungsten.

An anti-reflective layer 142 may be formed on the upper electrode structure, and may include, e.g., silicon oxynitride.

Figure 2B:
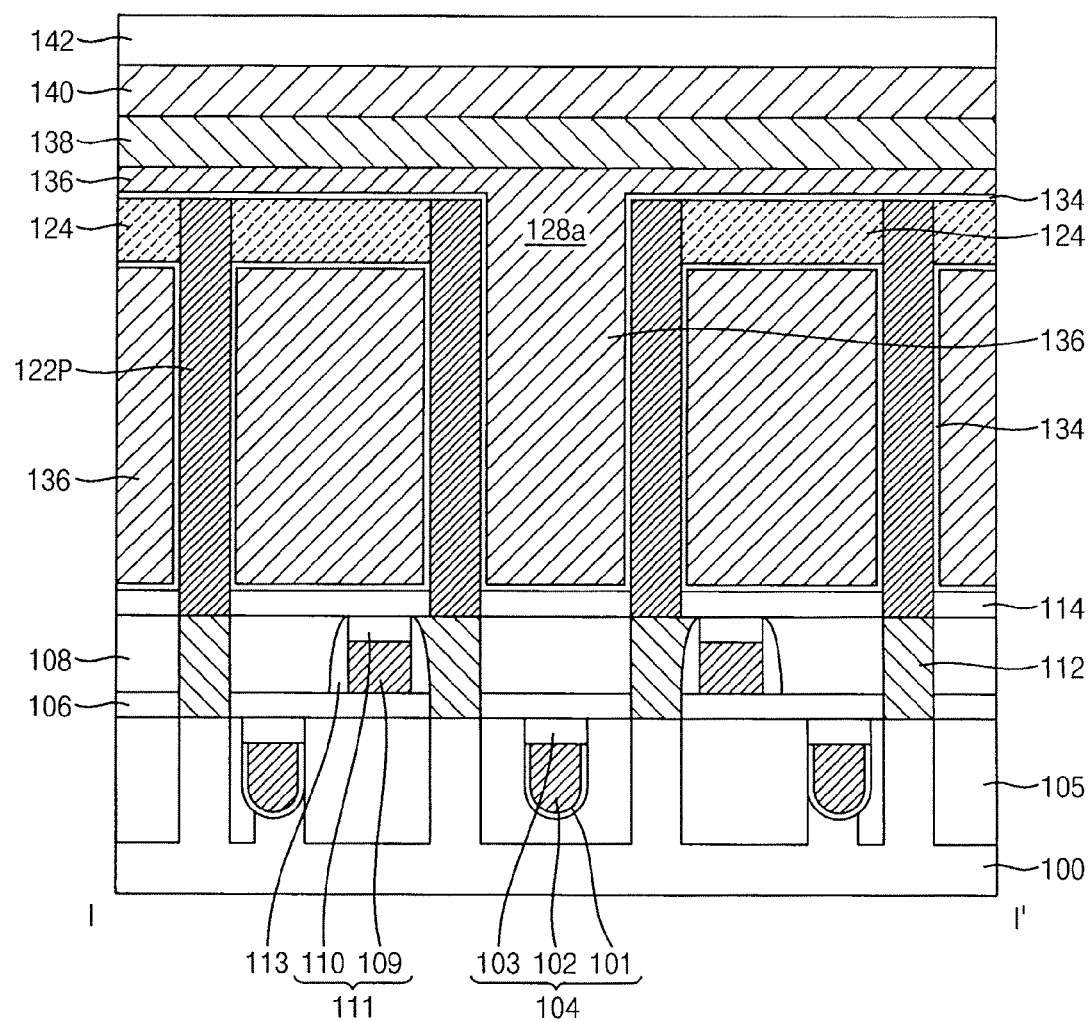

Referring to FIG. 2B, the semiconductor device may be substantially the same as that of FIG. 2A except for the electrode structure. For example, the semiconductor device may include a second electrode structure, which may include a pillar-shaped lower electrode 122P instead of the cylindrical lower electrode 122S shown in FIG. 2A.

Figure 2C:
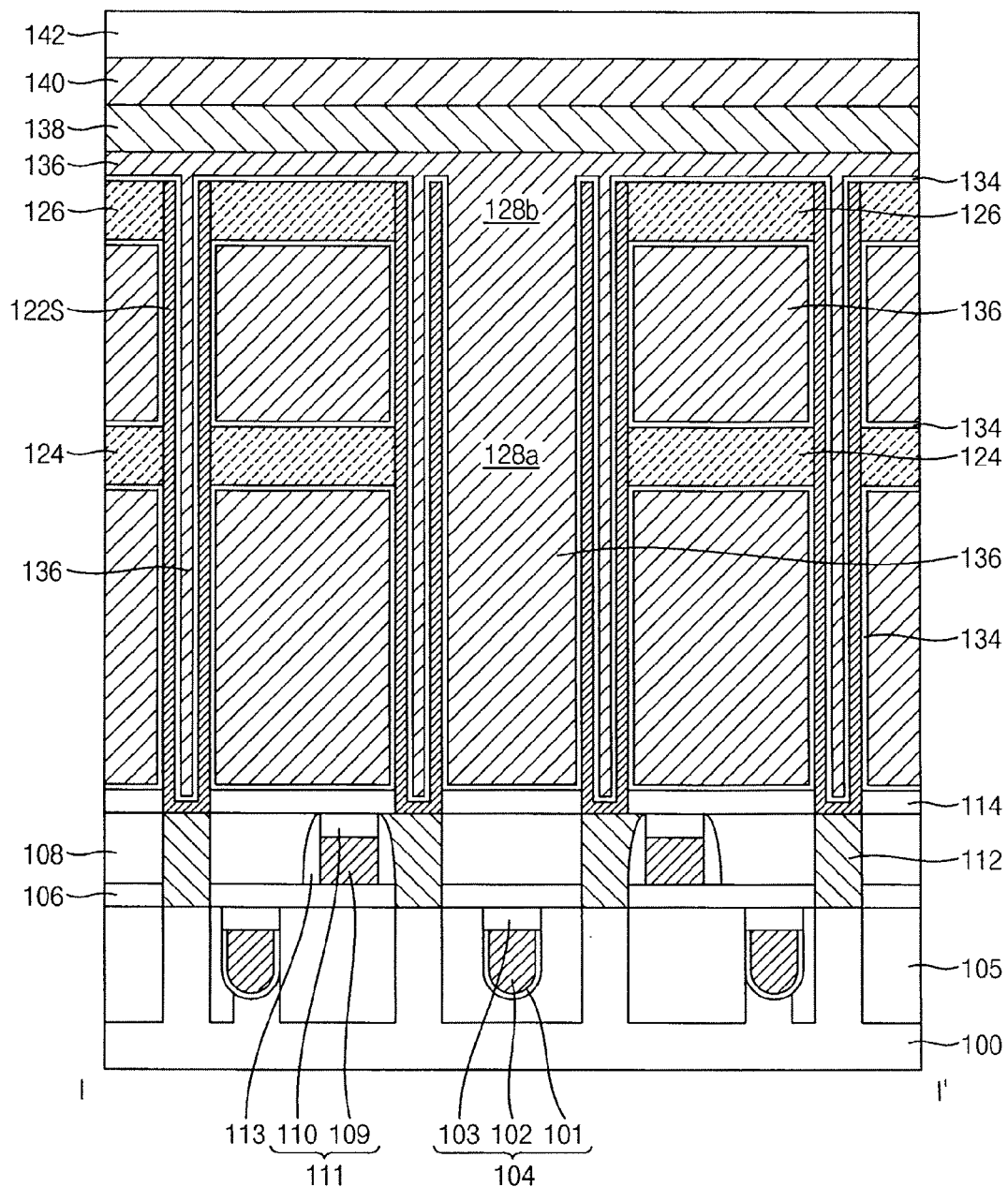

Referring to FIG. 2C, the semiconductor device may be substantially the same as that of FIG. 2A except for the support pattern structure. For example, the semiconductor device may include a second support pattern structure, which may further include a second support pattern 126 in addition to the first support pattern 124 of the first support pattern structure shown in FIG. 2A, which may be formed at a position higher than that of the first support pattern 124.

The second support pattern 126 may be disposed between the first electrode structures, and contact at least a portion of each first electrode structure. In an exemplary embodiment, the first support pattern 124 may contact a portion of the first electrode structure that may be located at a position higher than half of the total height of the first electrode structure, and the second support pattern 126 may contact an upper portion of the first electrode structure. A top surface of the second support pattern 126 may be substantially coplanar with a top surface of the first electrode structure. The second support pattern 126 may include a second open area 128b as the first support pattern 124 may include the first open area 128a. In an exemplary embodiment, the first and second open areas 128a and 128b may vertically overlap each other at least partially.

The second support pattern 126 may include an insulating material containing oxygen, e.g., silicon oxide and/or silicon oxynitride, and the first support pattern 124 may include, e.g., an oxide and/or a nitride.

In an exemplary embodiment, a width of an upper portion of the first electrode structure may be greater than a width of a lower portion thereof. Thus, a distance between lower portions of neighboring first electrode structures may be greater than a distance between upper portions of thereof. In addition, a length of a portion of the first support pattern 124 between neighboring first electrode structures may be greater than a length of a portion of the second support pattern 126 between neighboring second electrode structures.

FIG. 2C shows the second support pattern structure includes two support patterns 124 and 126. However, the present inventive concept is not limited thereto. For example, the second support pattern structure may also include more than two support patterns. In this case, an uppermost support pattern among the support patterns of the second support pattern structure may include an insulating material containing oxygen, e.g., silicon oxide and/or silicon oxynitride, and a top surface of the uppermost support pattern may be substantially coplanar with a top surface of the first electrode structure.

Figure 2D:
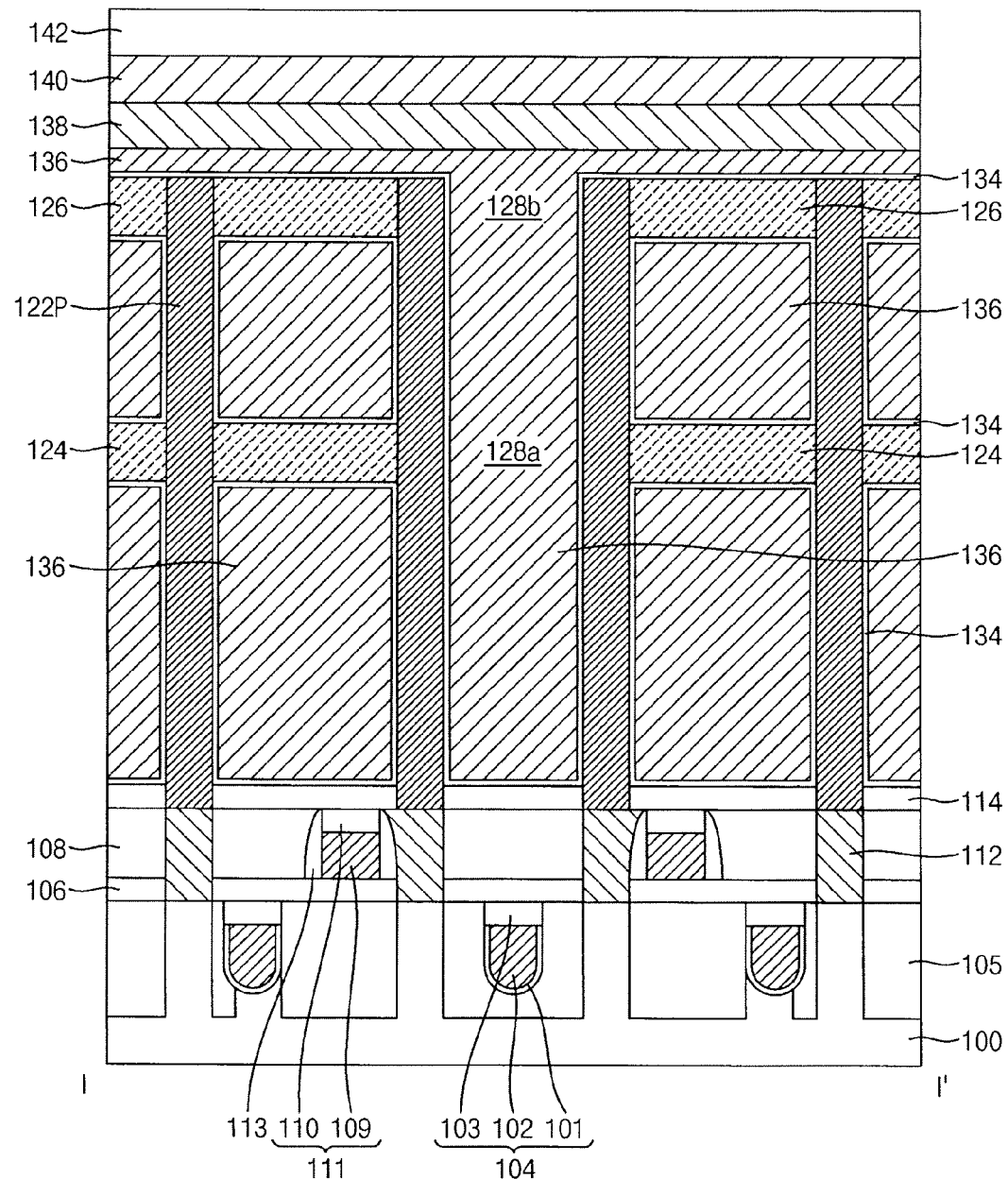

Referring to FIG. 2D, the semiconductor device may be substantially the same as that of FIG. 2C except for the electrode structure. For example, the semiconductor device may include a second electrode structure, which may include a pillar-shaped lower electrode 122P.

Figure 2E:
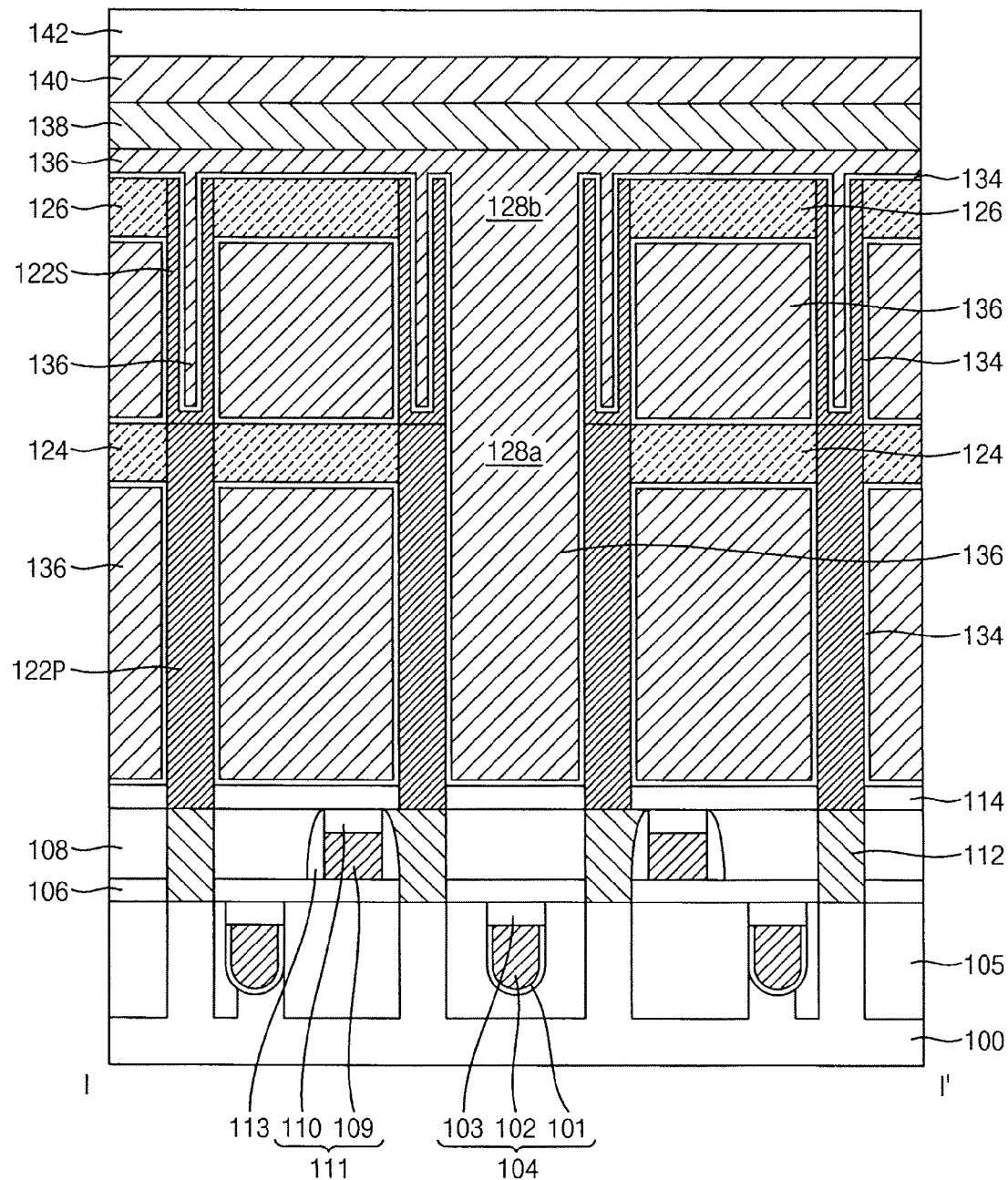

Referring to FIG. 2E, the semiconductor device may be substantially the same as that of FIG. 2C except for the electrode structure.

For example, the semiconductor device may include a third electrode structure, which may include first and second electrodes sequentially stacked on the substrate 100. The second electrode may be formed on the first electrode to vertically overlap the first electrode. In an exemplary embodiment, the first electrode may be a pillar-shaped lower electrode 122P, and the second electrode may be a cylindrical lower electrode 122S. However, the present inventive concept is not limited thereto, and the first and second electrodes may include a combination of the cylindrical electrode and the pillar-shaped electrode. For example, the third electrode structure may include a cylindrical first electrode and a cylindrical second electrode, a cylindrical first electrode and a pillar-shaped second electrode, a pillar-shaped first electrode and a cylindrical second electrode, or a pillar-shaped first electrode and a pillar-shaped second electrode.

A top surface of the first electrode may be substantially coplanar with a top surface of the first support pattern 124, and a top surface of the second electrode may be substantially coplanar with a top surface of the second support pattern 126.

FIGS. 3A, 3B, 3C, 3D, 3E, and 3F are cross-sectional views illustrating stages of a method of manufacturing a semiconductor device in accordance with an exemplary embodiment. This method may be used for manufacturing the semiconductor device shown in FIGS. 2A and/or FIG. 2B. However, the present inventive concept is not limited thereto. Elements of the semiconductor device shown in FIGS. 3A, 3B, 3C, 3D, 3E and 3F may be substantially the same as those shown in FIGS. 1A and 1B, or FIGS. 2A to 2E. Thus, like reference numerals refer to like elements, and detailed explanations thereon are omitted herein.

Figure 3A:
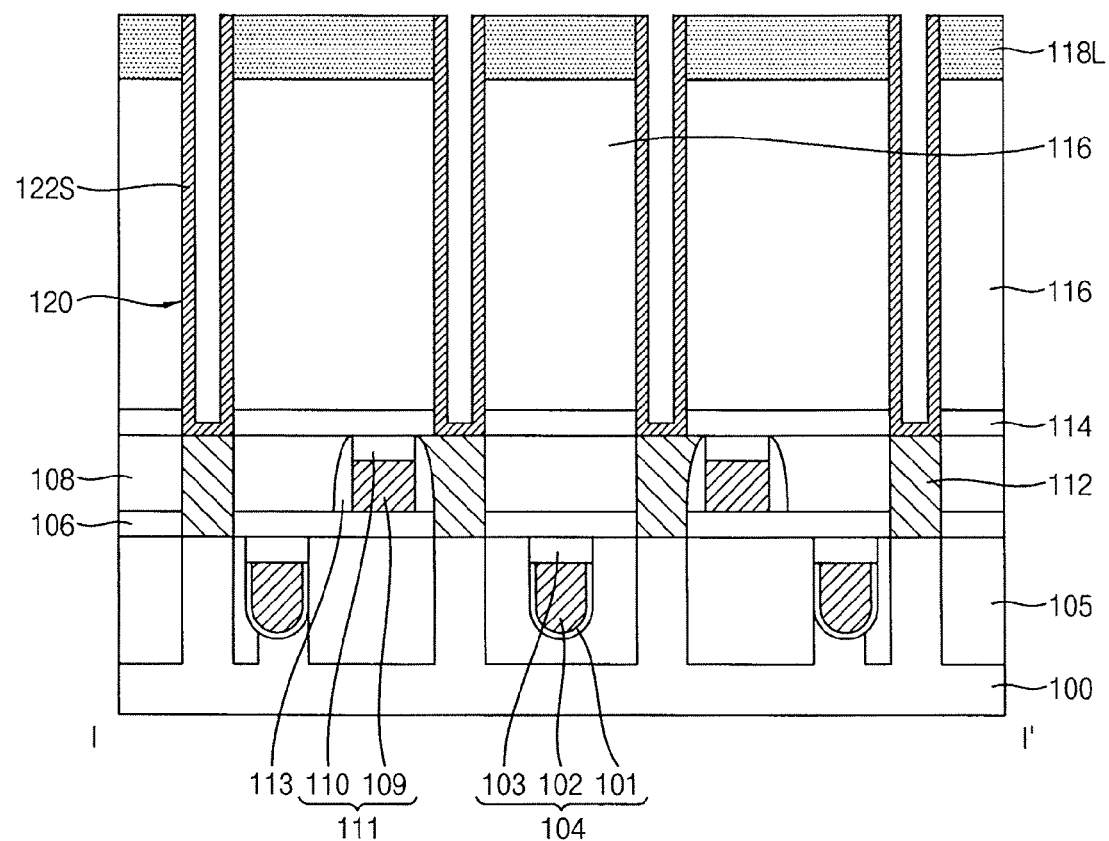
FIGS. 3A, 3B, 3C, 3D, 3E, and 3F are cross-sectional views illustrating stages of a method of manufacturing a semiconductor device in accordance with an exemplary embodiment.

Referring to FIG. 3A, an isolation layer 105 may be formed in a substrate 100 to define an active region and a field region therein. A gate structure 104 may be formed through the active region of the substrate 100 and the isolation layer 105. In an exemplary embodiment, the gate structure 104 may be formed to include a gate insulation layer pattern 101, a gate electrode 102 and a capping layer pattern 103.

A cell blocking layer 106 may be formed on the substrate 100 and the isolation layer 105. A bit line structure 111 may be formed on the cell blocking layer 106 to be electrically connected to a first portion of the active region of the substrate 100. The first portion of the active region of the substrate 100 may serve as a first source/drain region (not shown). In an exemplary embodiment, the bit line structure 111 may be formed to include a bit line 109 and a mask 110 sequentially stacked. A spacer 113 may be further formed on a sidewall of the bit line structure 111. The cell blocking layer 106 may be formed of, e.g., silicon oxide, silicon nitride, silicon oxynitride, or a combination thereof.

An insulating interlayer 108 may be formed on the substrate 100 to cover the bit line structure 111 and the spacer 113. The insulating interlayer 108 may be formed of, e.g., silicon oxide. An upper portion of the insulating interlayer 108 may be planarized until a top surface of the bit line structure 111 may be exposed, and a contact pad 112 may be formed through the insulating interlayer 108 and the cell blocking layer 106. The contact pad 112 may be electrically connected to a second portion of the active region of the substrate 100. The second portion of the active region of the substrate 100 may serve as a second source/drain region (not shown).

An etch stop layer 114, a first mold layer 116 and a preliminary support layer 118L may be sequentially formed on the insulating interlayer 108 through which the contact pad 112 may be formed. The etch stop layer 114 may be formed of, e.g., silicon nitride. The first mold layer 116 may be formed of, e.g., a material having an etching selectivity with respect to the preliminary support layer 118L. In an exemplary embodiment, the first mold layer 116 may be formed to include a semiconductor oxide layer and/or a semiconductor layer. The semiconductor oxide layer may be formed of an oxide, e.g., tetra ethyl ortho silicate (TEOS) oxide, high density plasma (HDP) oxide, etc. The HDP oxide may have an etch rate less than that of the TEOS oxide. In an exemplary embodiment, the first mold layer 116 may be formed to include a TEOS oxide layer and an HDP oxide layer sequentially stacked on the etch stop layer 114. The semiconductor layer may be formed of, e.g., polysilicon, amorphous silicon, and/or silicon-germanium, etc.

The preliminary support layer 118L may be formed of, e.g., a material having an etching selectivity with respect to the first mold layer 116. For example, the preliminary support layer 118L may be formed of silicon nitride.

The preliminary support layer 118L, the first mold layer 116 and the etch stop layer 114 may be partially removed to form a first contact hole 120 therethrough. The first contact hole 120 may expose at least a portion of a top surface of the contact pad 112. In an exemplary embodiment, a plurality of first contact holes 120 may be formed.

A first electrode structure may be formed in each first contact hole 120 to be electrically connected to the contact pad 112. In an exemplary embodiment, the first electrode structure may include a cylindrical lower electrode 122S. However, the present inventive concept is not limited thereto, and a second electrode structure including a pillar-shaped lower electrode 122P may be also formed in the first contact hole 120. Each of the first and second electrode structures, e.g., the cylindrical lower electrode 122S and/or the pillar-shaped lower electrode 122P (refer to FIG. 2B) may be formed of, e.g., doped polysilicon, a metal, e.g., tungsten, titanium, ruthenium, etc., a metal oxide, e.g., ruthenium oxide, a metal nitride, e.g., titanium nitride, tungsten nitride, etc., or a combination thereof.

Hereinafter, only the semiconductor device including the first electrode structure having the cylindrical lower electrode 122S will be illustrated, for the convenience of explanation.

Figure 3B:
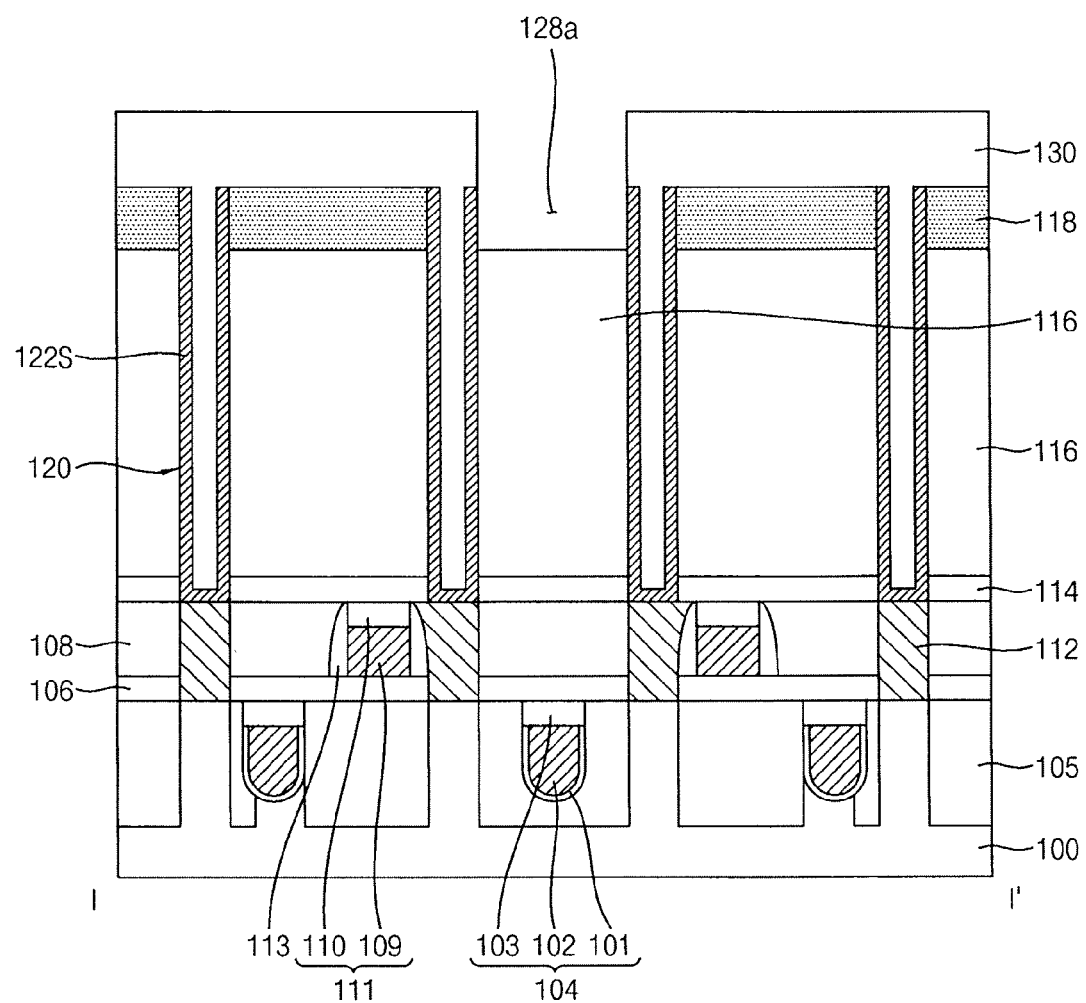

Referring to FIG. 3B, a portion of the preliminary support layer 118L between the cylindrical lower electrodes 122S may be removed using the first mask pattern 130 as an etching mask to form a preliminary support layer pattern 118 having a first open area 128a exposing a portion of a top surface of the first mold layer 116.

Figure 3C:
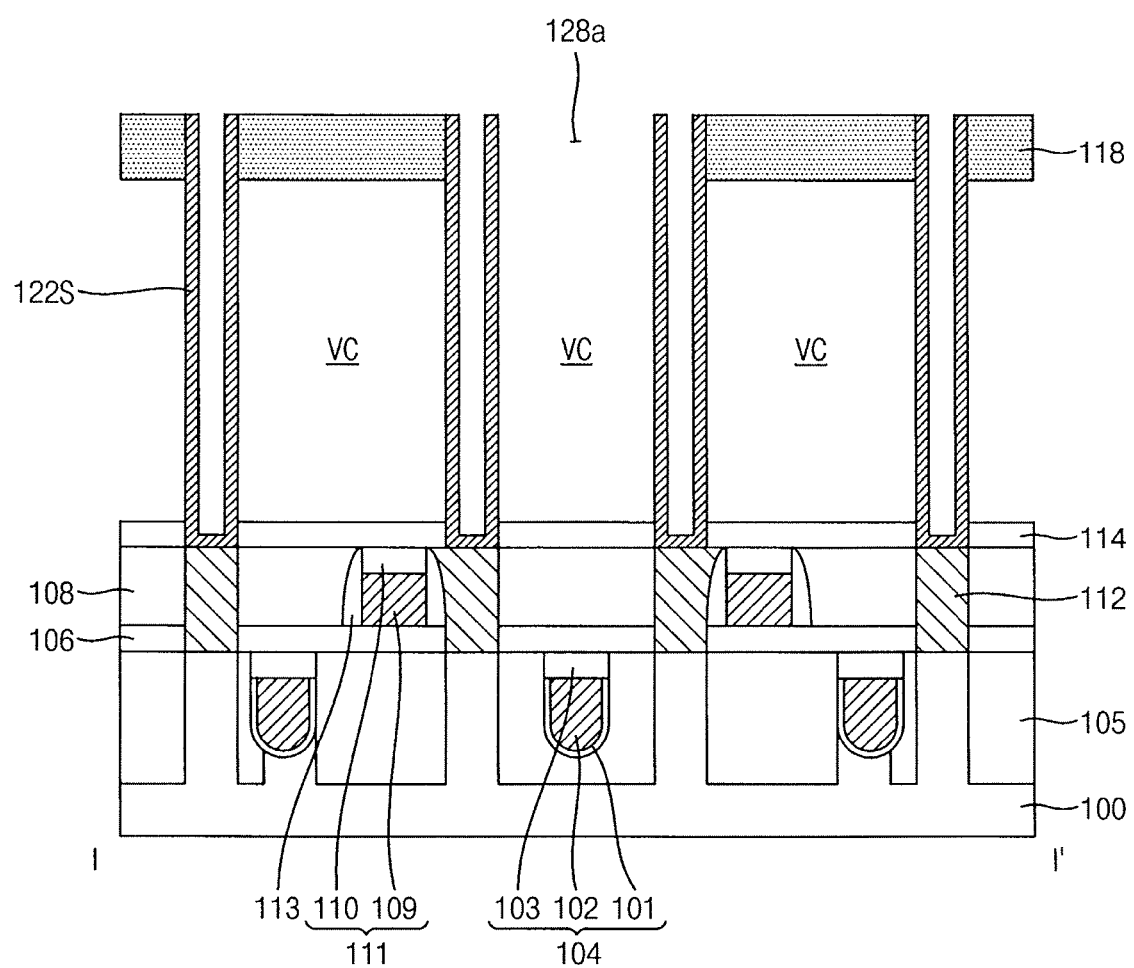

Referring to FIG. 3C, before or after removing the first mask pattern 130, the first mold layer 116 may be removed to form a void VC exposing a surface of the cylindrical lower electrodes 122S.

In an exemplary embodiment, the first mold layer 116 may be removed by providing an etching solution through the first open area 128a. The first mold layer 116 may have an etch rate with respect to the etching solution greater than those of the preliminary support layer pattern 118 and the etch stop layer 114.

Figure 3D:
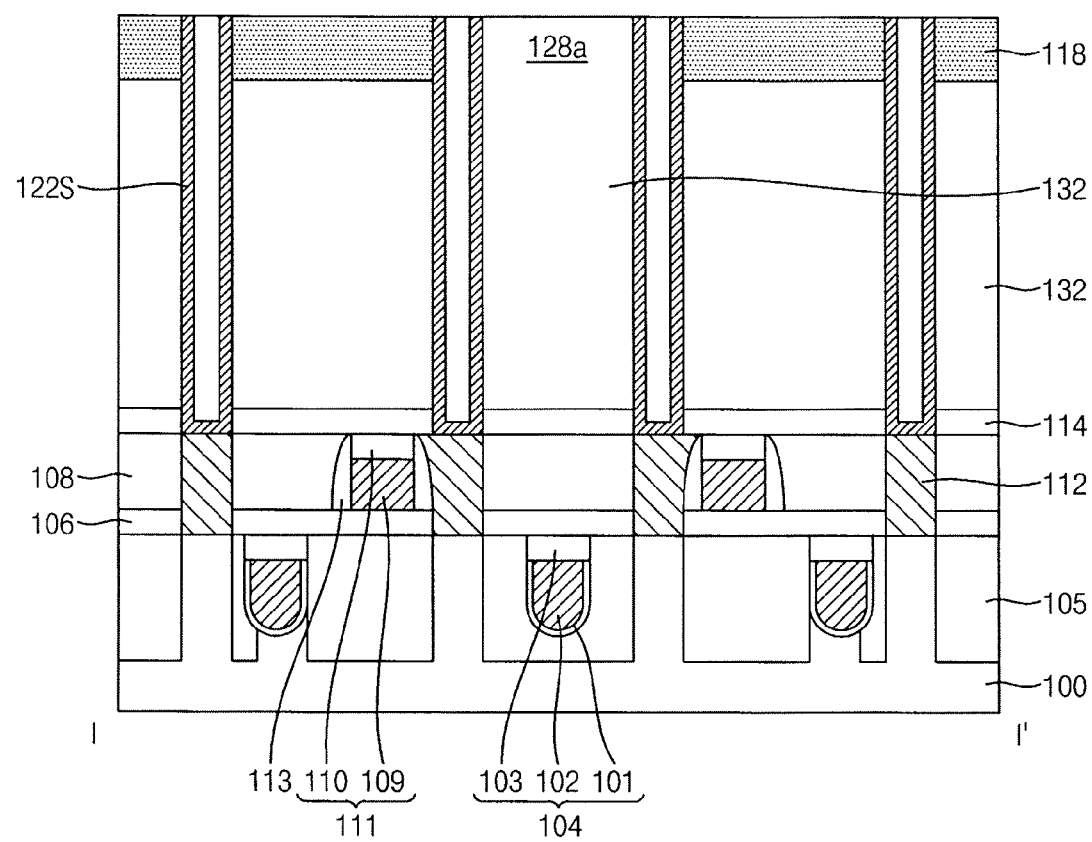

Referring to FIG. 3D, the void VC may be filled with a sacrificial layer 132.

The sacrificial layer 132 may be formed of a material having an etching selectivity with respect to the preliminary support layer pattern 118. Thus, the sacrificial layer 132 may be formed of, e.g., spin on hardmask (SOH) and/or undoped polysilicon. When the cylindrical lower electrode 122S includes doped polysilicon, the sacrificial layer 132 may be formed of a material other than undoped polysilicon.

Figure 3E:
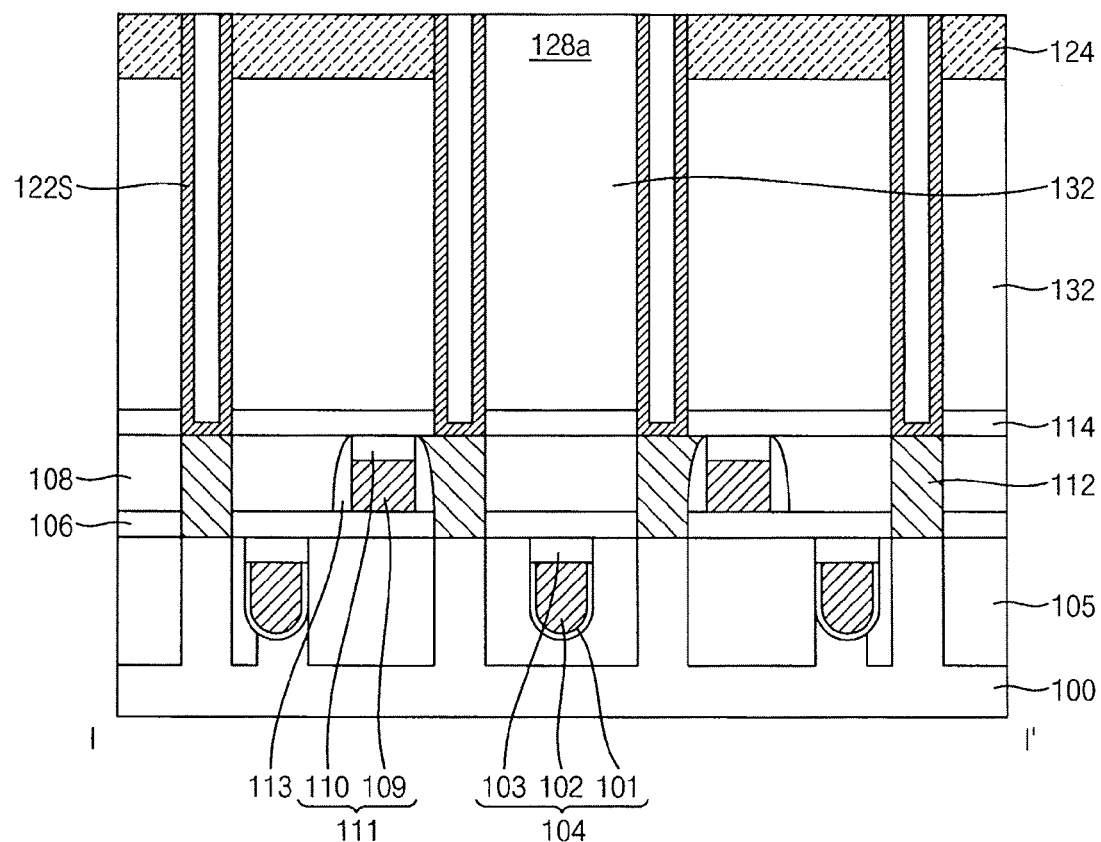

Referring to FIG. 3E, the preliminary support layer pattern 118 may be replaced with a first support pattern 124.

In an exemplary embodiment, the first support pattern 124 may be formed by removing the preliminary support layer pattern 118 to expose a top surface of the sacrificial layer 132, forming a support layer on the exposed top surface of the sacrificial layer 132, and planarizing the support layer until top surfaces of the cylindrical lower electrodes 122S may be exposed. In an exemplary embodiment, the planarization process may include a chemical mechanical polishing (CMP) process and/or an etch back process. Thus, the first support pattern 124 may be formed on the sacrificial layer 132 except for the first open area 128a, to have a top surface substantially coplanar with the top surfaces of the cylindrical lower electrodes 122S.

The first support pattern 124 may be formed of a material having an etching selectivity with respect to the sacrificial layer 132. In an exemplary embodiment, the first support pattern 124 may be formed of a material (e.g., an insulating material having oxygen such as silicon oxide and/or silicon oxynitride) different from that of the preliminary support layer pattern 118.

Figure 3F:
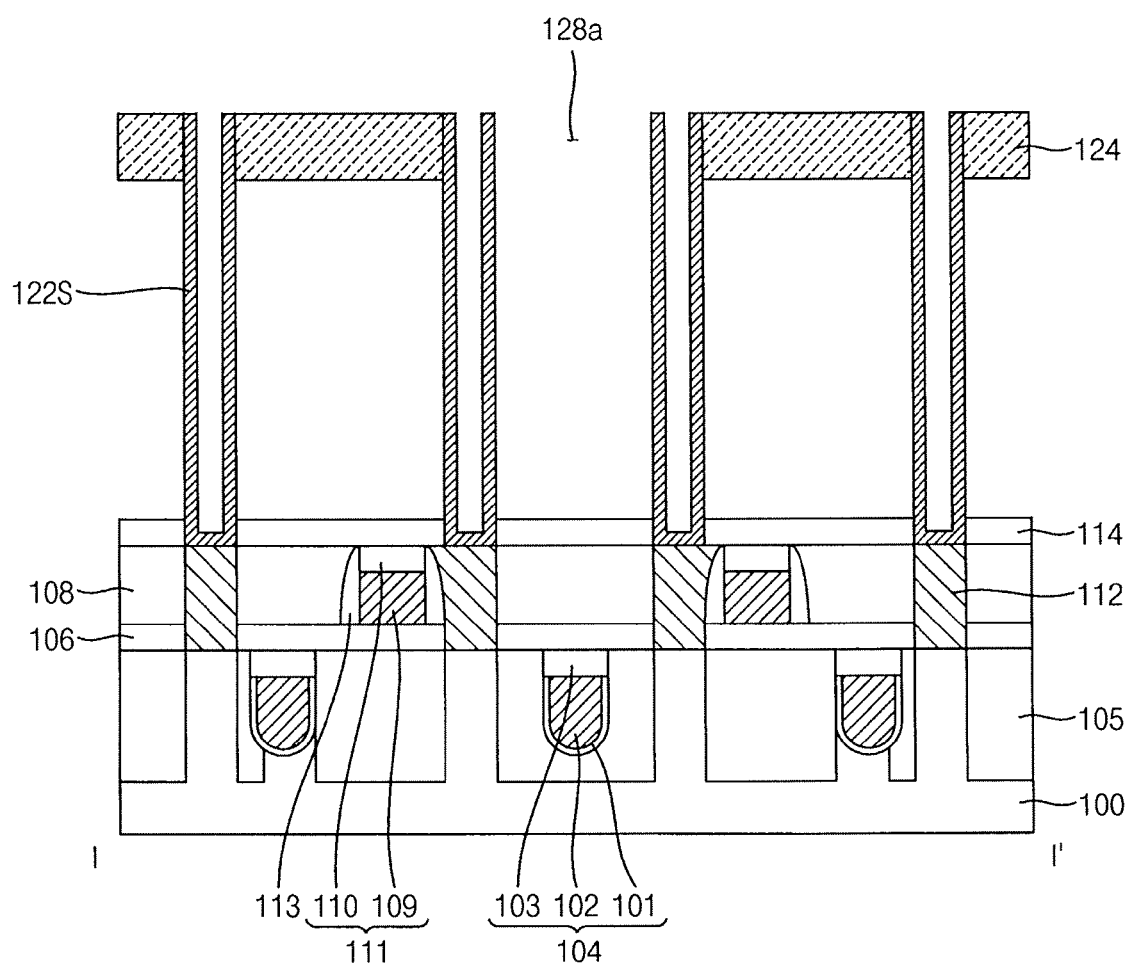

Referring to FIG. 3F, the sacrificial layer 132 may be removed to expose surfaces of the cylindrical lower electrodes 122S. However, the first support pattern 124 may still remain and contact upper portions of the cylindrical lower electrodes 122S.

In an exemplary embodiment, the sacrificial layer 132 may be removed by providing an etching solution through the first open area 128a. The sacrificial layer 132 may have an etch rate with respect to the etching solution greater than those of the first support pattern 124 and the etch stop layer 114.

A dielectric layer 134, a first upper electrode 136, a second upper electrode 138, a third upper electrode 140 and an anti-reflective layer 142 may be sequentially formed on the cylindrical lower electrodes 122S to manufacture the semiconductor device shown in FIG. 2A and/or FIG. 2B.

In the above method of manufacturing the semiconductor device, the first support pattern 124 may be formed of an oxide having a compact structure of layer, and thus the cylindrical lower electrode 122S or the pillar-shaped lower electrode 122P may be formed to have a large width. Accordingly, the leakage current between neighboring lower electrodes 122S and 122P may be reduced while the capacitance of a capacitor may be increased. As the capacitance of the capacitor may be increased, the cylindrical lower electrode 122S or the pillar-shaped lower electrode 122P may be formed to have a relatively low height.

FIGS. 4A, 4B, 4C, 4D, 4E, and 4F are cross-sectional views illustrating stages of a method of manufacturing a semiconductor device in accordance with an exemplary embodiment. This method may be used for manufacturing the semiconductor device shown in FIG. 2C, FIG. 2D, and/or FIG. 2E. However, the present inventive concept is not limited thereto. Elements of the semiconductor device shown in FIGS. 4A, 4B, 4C, 4D, 4E and 4F may be substantially the same as those shown in FIGS. 3A, 3B, 3C, 3D, 3E and 3F. Thus, like reference numerals refer to like elements, and detailed explanations thereon are omitted herein.

Figure 4A:
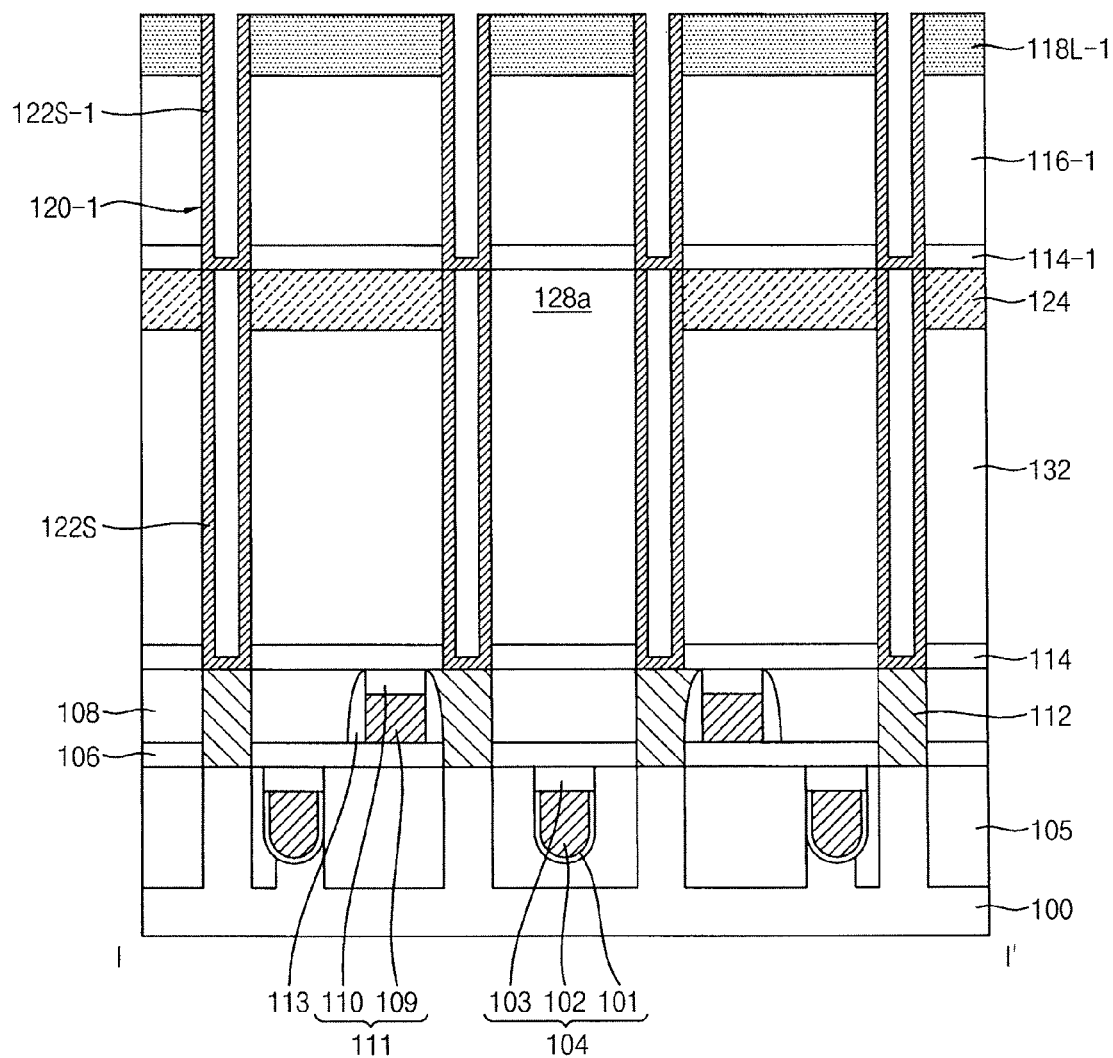
FIGS. 4A, 4B, 4C, 4D, 4E, and 4F are cross-sectional views illustrating stages of a method of manufacturing a semiconductor device in accordance with an exemplary embodiment.

Referring to FIG. 4A, an additional etch stop layer 114-1, an additional first mold layer 116-1 and an additional preliminary support layer 118L-1 may be sequentially formed on the resultant structure shown in FIG. 3E. The additional etch stop layer 114-1, the additional first mold layer 116-1, and the additional preliminary support layer 118L-1 may be substantially the same as the etch stop layer 114, the first mold layer 116, and the preliminary support layer 118L, respectively. Thus, detailed explanation thereon are omitted herein. In an exemplary embodiment, the additional etch stop layer 114-1 may not be formed.

The additional preliminary support layer 118L-1, the additional first mold layer 116-1 and the additional etch stop layer 114-1 may be partially removed to form an additional first contact hole 120-1 therethrough. The additional first contact hole 120-1 may expose at least a portion of a top surface of each cylindrical lower electrode 122S.

A cylindrical additional lower electrode 122S-1 may be formed in each additional first contact hole 120-1 to contact the exposed cylindrical lower electrode 122S. However, the present inventive concept is not limited thereto, and a pillar-shaped additional lower electrode may be formed on the exposed cylindrical lower electrode 122S instead of the cylindrical additional lower electrode 122S-1.

For example, the lower electrode and the additional lower electrode may be a combination of a cylindrical lower electrode and a pillar-shaped lower electrode. Thus, a cylindrical lower electrode and a cylindrical additional lower electrode, a cylindrical lower electrode and a pillar-shaped additional lower electrode, a pillar-shaped lower electrode and a cylindrical additional lower electrode, and a pillar-shaped lower electrode and a pillar-shaped additional lower electrode may be formed. Hereinafter, only the semiconductor device including the cylindrical lower electrode and the cylindrical additional lower electrode will be illustrated for the convenience of explanation.

The cylindrical additional lower electrode 122S-1 may be formed of a material substantially the same as that of the cylindrical lower electrode 122S illustrated with reference to FIGS. 3A to 3F.

Figure 4B:
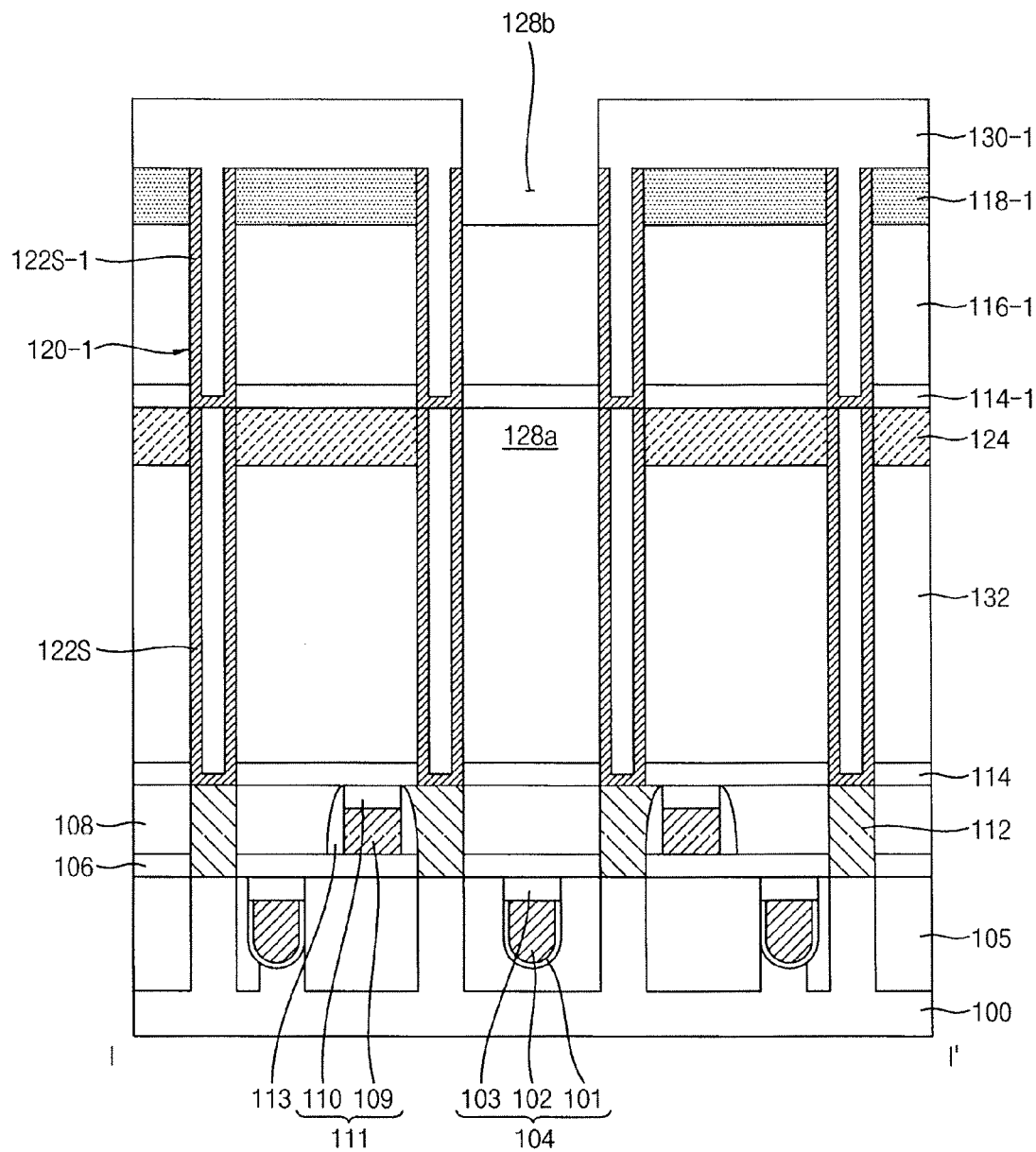

Referring to FIG. 4B, a process substantially the same as that illustrated with reference to FIG. 3B may be performed, and thus an additional preliminary support layer pattern 118-1 having a second open area 128b may be formed using an additional first mask pattern 130-1 as an etching mask. In an exemplary embodiment, the second open area 128b may be formed to vertically overlap the first open area 128a at least partially.

Figure 4C:
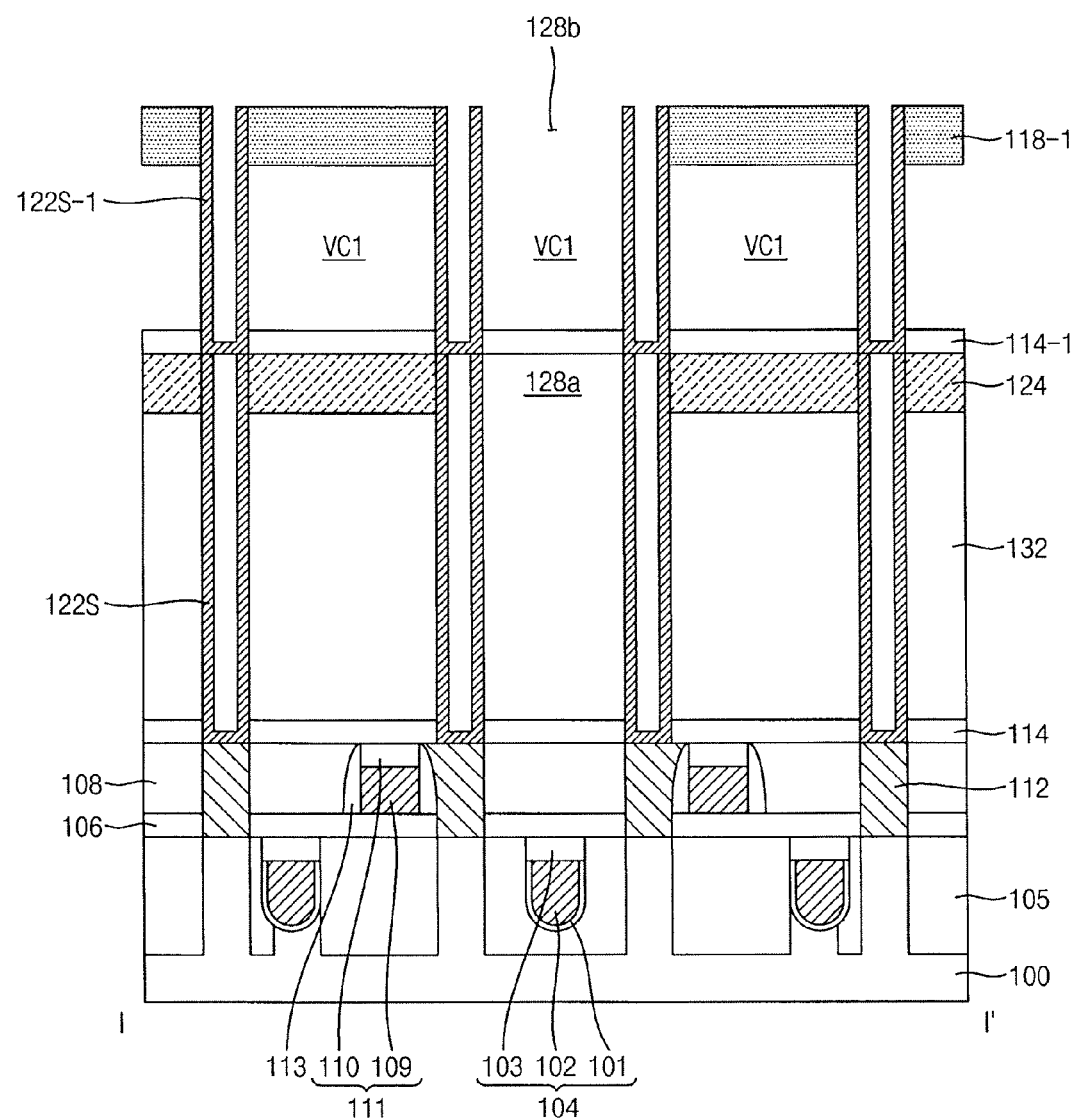

Referring to FIG. 4C, a process substantially the same as that illustrated with reference to FIG. 3C may be performed, and thus the additional first mold layer 116-1 may be removed to form an additional void VC1 exposing a surface of the cylindrical additional lower electrodes 122S-1.

Figure 4D:
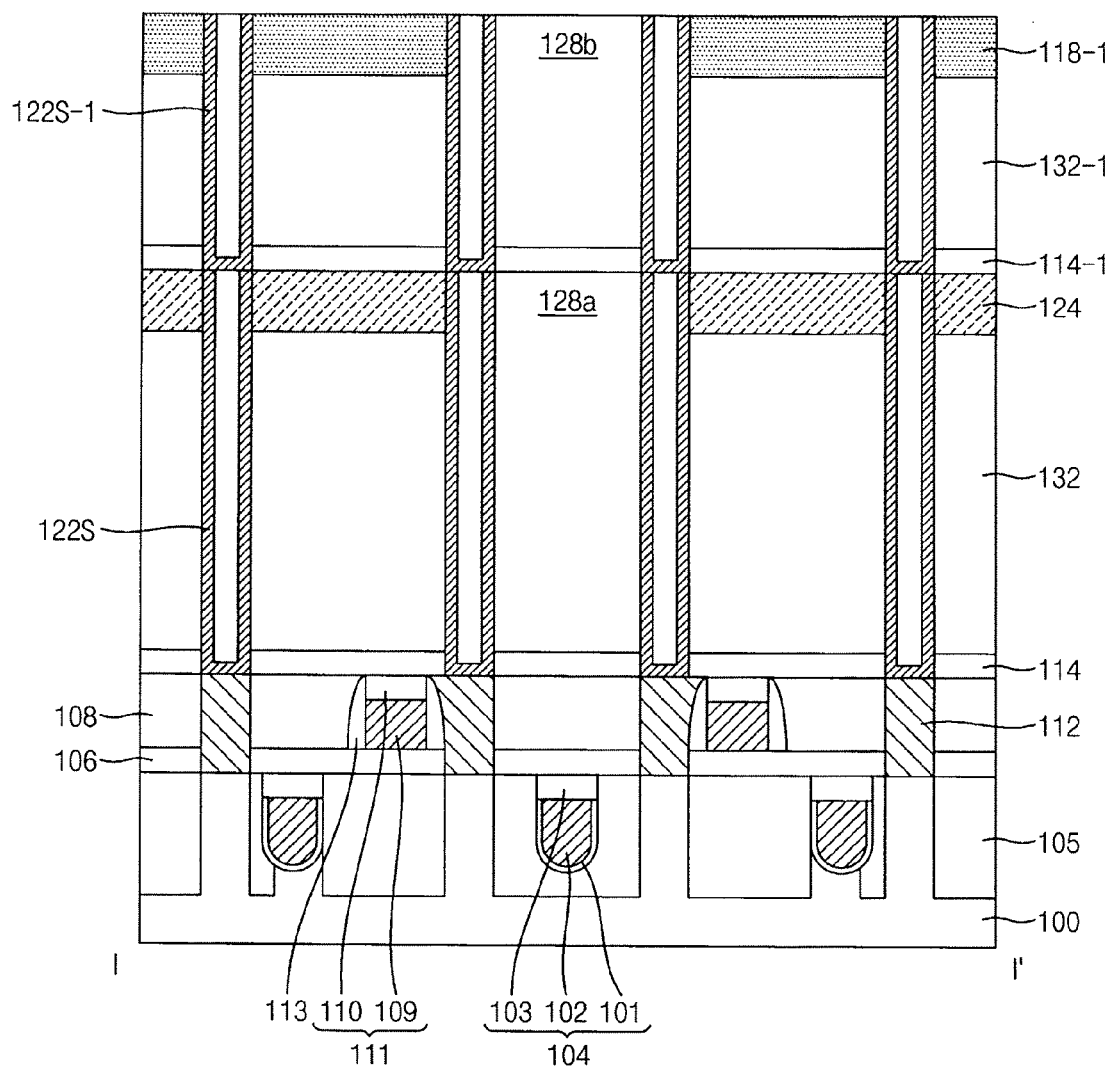

Referring to FIG. 4D, a process substantially the same as that illustrated with reference to FIG. 3D may be performed, and thus the additional void VC1 may be filled with an additional sacrificial layer 132-1. The additional sacrificial layer 132-1 may be formed of, e.g., spin on hardmask (SOH) and/or undoped polysilicon.

Figure 4E:
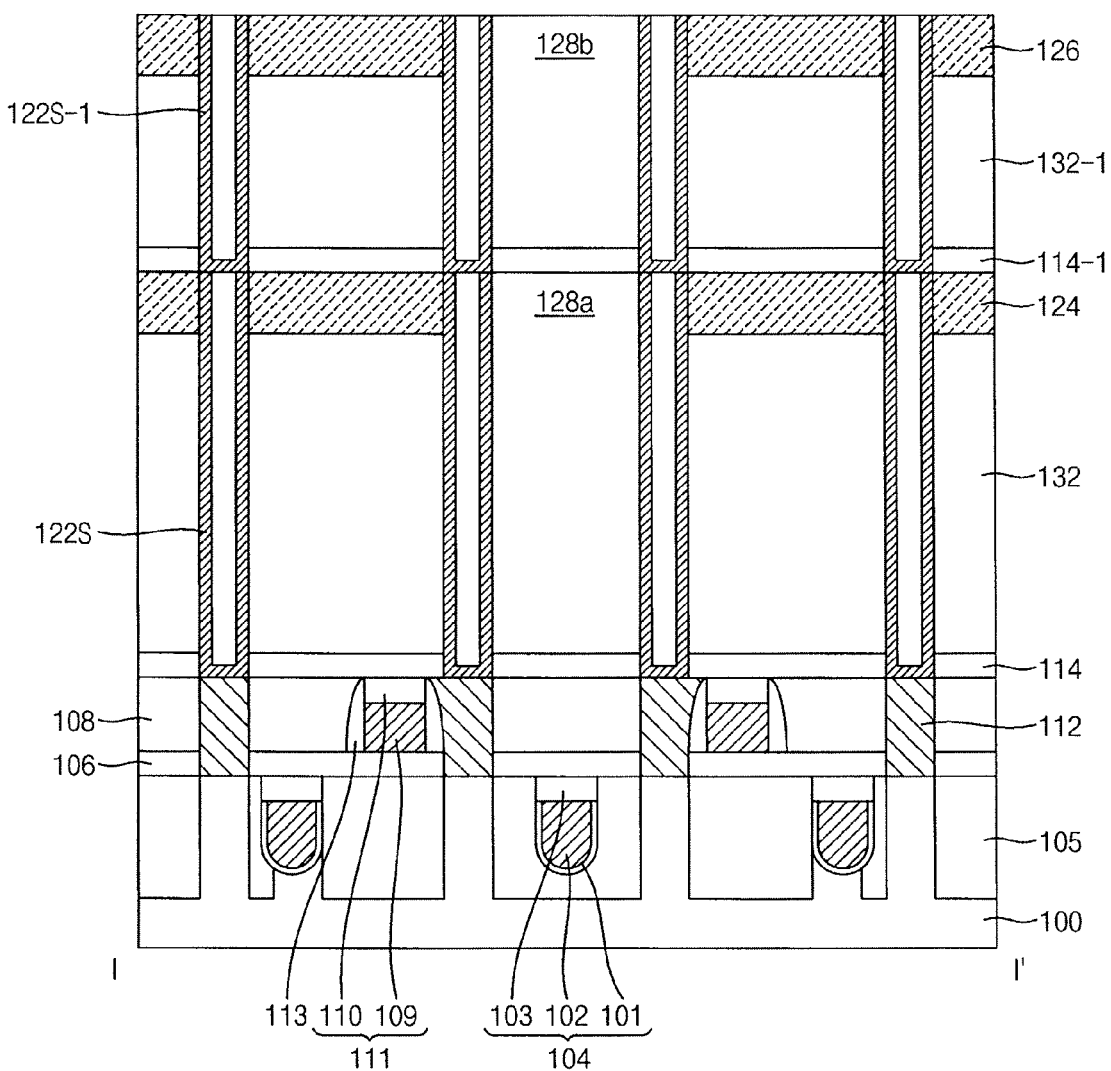

Referring to FIG. 4E, a process substantially the same as that illustrated with reference to FIG. 3E may be performed, and thus the additional preliminary support layer pattern 118-1 may be replaced with a second support pattern 126. The second support pattern 126 may be formed by: removing the additional preliminary support layer pattern 118-1 to expose a top surface of the additional sacrificial layer 132-1; forming an additional support layer on the exposed top surface of the additional sacrificial layer 132-1; and planarizing the additional support layer until top surfaces of the cylindrical additional lower electrodes 122S-1 is exposed. In an exemplary embodiment, the planarization process may include a CMP process and/or an etch back process. Thus, the second support pattern 126 may be formed on the additional sacrificial layer 132-1 except for the second open area 128b, to have a top surface substantially coplanar with the top surfaces of the cylindrical additional lower electrodes 122S-1.

The first support pattern 124 may be formed of, e.g., an oxide and/or a nitride, and the second support pattern 126 may be formed of a material different from that of the additional preliminary support layer pattern 118-1, e.g., an insulating material containing oxygen such as silicon oxide and/or silicon oxynitride.

Figure 4F:
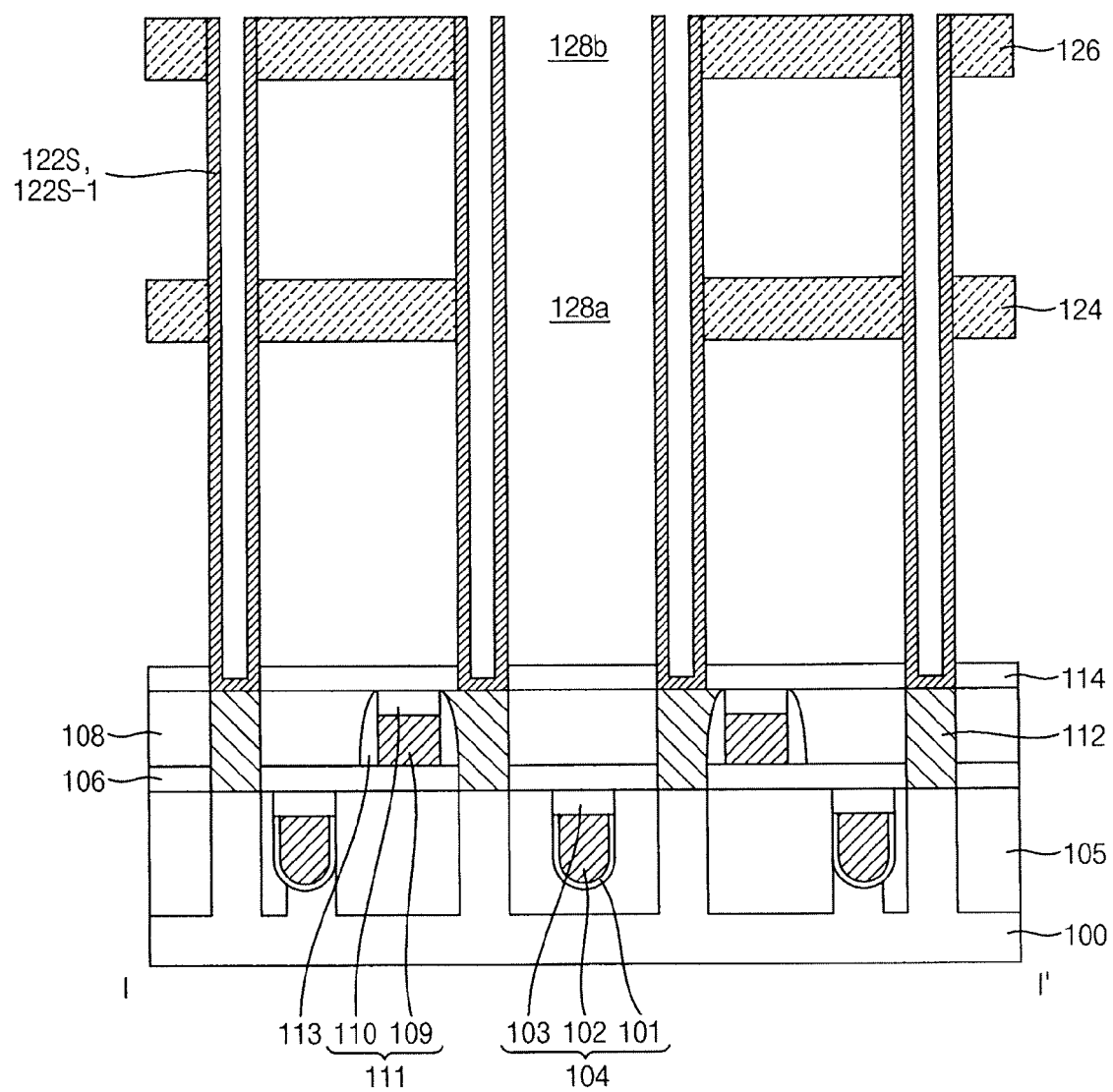

Referring to FIG. 4F, a process substantially the same as that illustrated with reference to FIG. 3F may be performed.

Thus, the sacrificial layer 132 and the additional sacrificial layer 132-1 may be removed to expose surfaces of the cylindrical lower electrodes 122S and the cylindrical additional lower electrodes 122S-1, and the first support pattern 124 and the second support pattern 126 may remain and contact upper portions of the cylindrical lower electrodes 122S and upper portions of the cylindrical additional lower electrodes 122S-1, respectively. The sacrificial layer 132 and the additional sacrificial layer 132-1 may be removed by providing an etching solution through the first open area 128a and the second open area 128b, respectively. The sacrificial layer 132 and the additional sacrificial layer 132-1 may have etch rates with respect to the etching solution greater than those of the first support pattern 124, the second support pattern 126, and the etch stop layer 114.

The additional etch stop layer 114-1 may be removed. However, the present inventive concept is not limited thereto, and thus, in an exemplary embodiment, the additional etch stop layer 114-1 may remain on the first support pattern 124 except for the first and second open areas 128a and 128b.

A portion of the sacrificial layer 132 filling an inner space defined by the cylindrical lower electrode 122S, a portion of the additional sacrificial layer 132-1 filling an inner space defined by the additional cylindrical lower electrode 122S-1, and a bottom portion of the cylindrical additional lower electrode 122S-1 may be removed, and thus, one whole structure of the cylindrical lower electrodes 122S and 122S-1 into which the cylindrical lower electrodes 122S and the cylindrical additional lower electrode 122S-1 are merged may be formed.

In an exemplary embodiment, before forming the cylindrical additional lower electrode 122S-1, the portion of the sacrificial layer 132 filling the inner space defined by the cylindrical lower electrode 122S may be removed.

In an exemplary embodiment, before forming the cylindrical additional lower electrode 122S-1, after forming an oxide layer or a nitride layer on the portion of the sacrificial layer 132 filling the inner space defined by the cylindrical lower electrode 122S, the portion of the additional sacrificial layer 132-1 filling the inner space defined by the cylindrical additional lower electrode 122S-1, the bottom portion of the cylindrical additional lower electrode 122S-1, the oxide layer or the nitride layer, and the portion of the sacrificial layer 132 filling the inner space defined by the cylindrical lower electrode 122S may be sequentially removed to form the one whole structure of the cylindrical lower electrodes 122S and 122S-1.

A dielectric layer 134, a first upper electrode 136, a second upper electrode 138, a third upper electrode 140, and an anti-reflective layer 142 may be sequentially formed on the cylindrical lower electrodes 122S and 122P to manufacture the semiconductor device shown in FIG. 2C, FIG. 2D, and/or FIG. 2E.

Figure 5A:
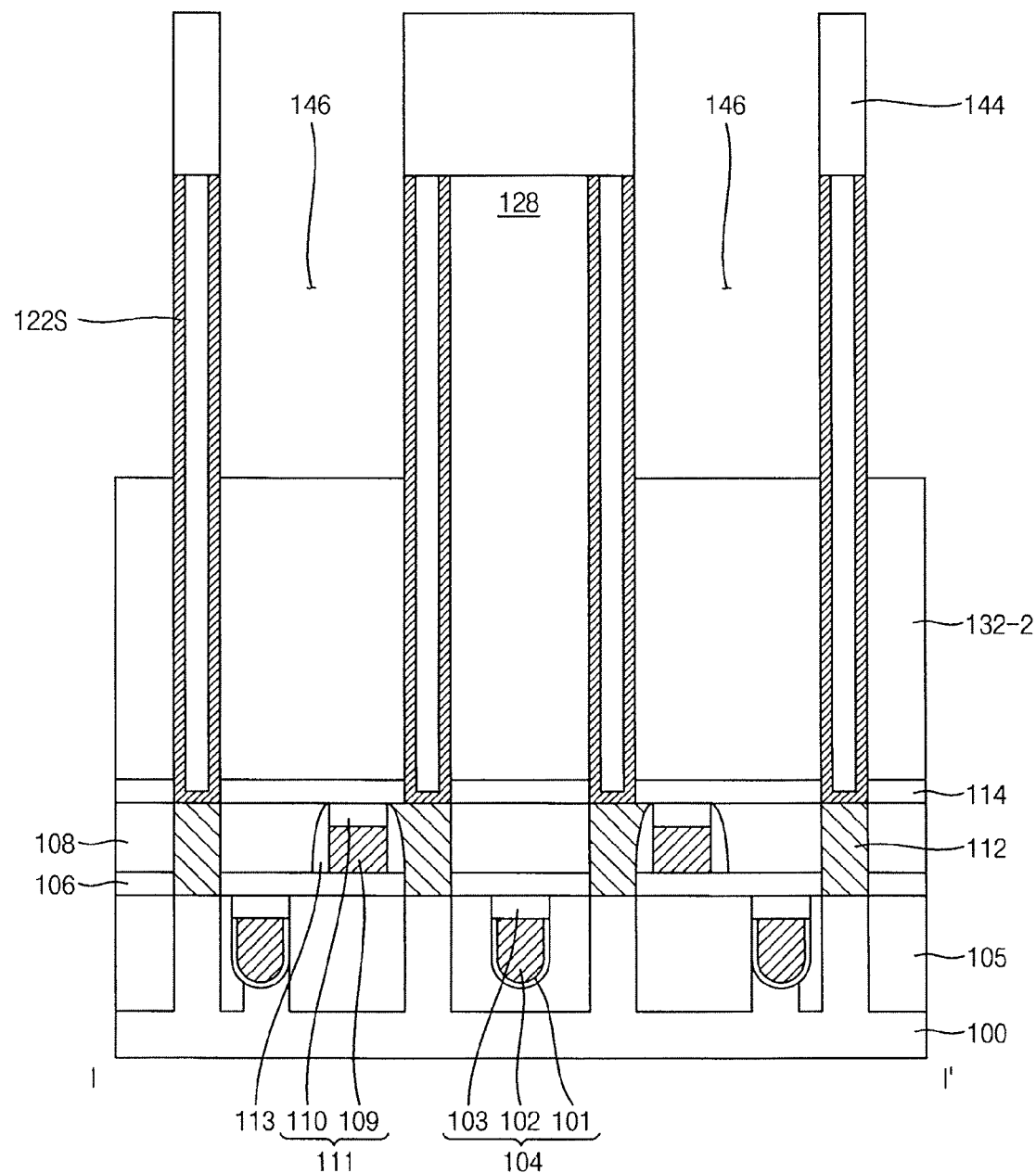
FIGS. 5A and 5B are cross-sectional views illustrating stages of a method of manufacturing a semiconductor device in accordance with an exemplary embodiment.
Figure 5B:
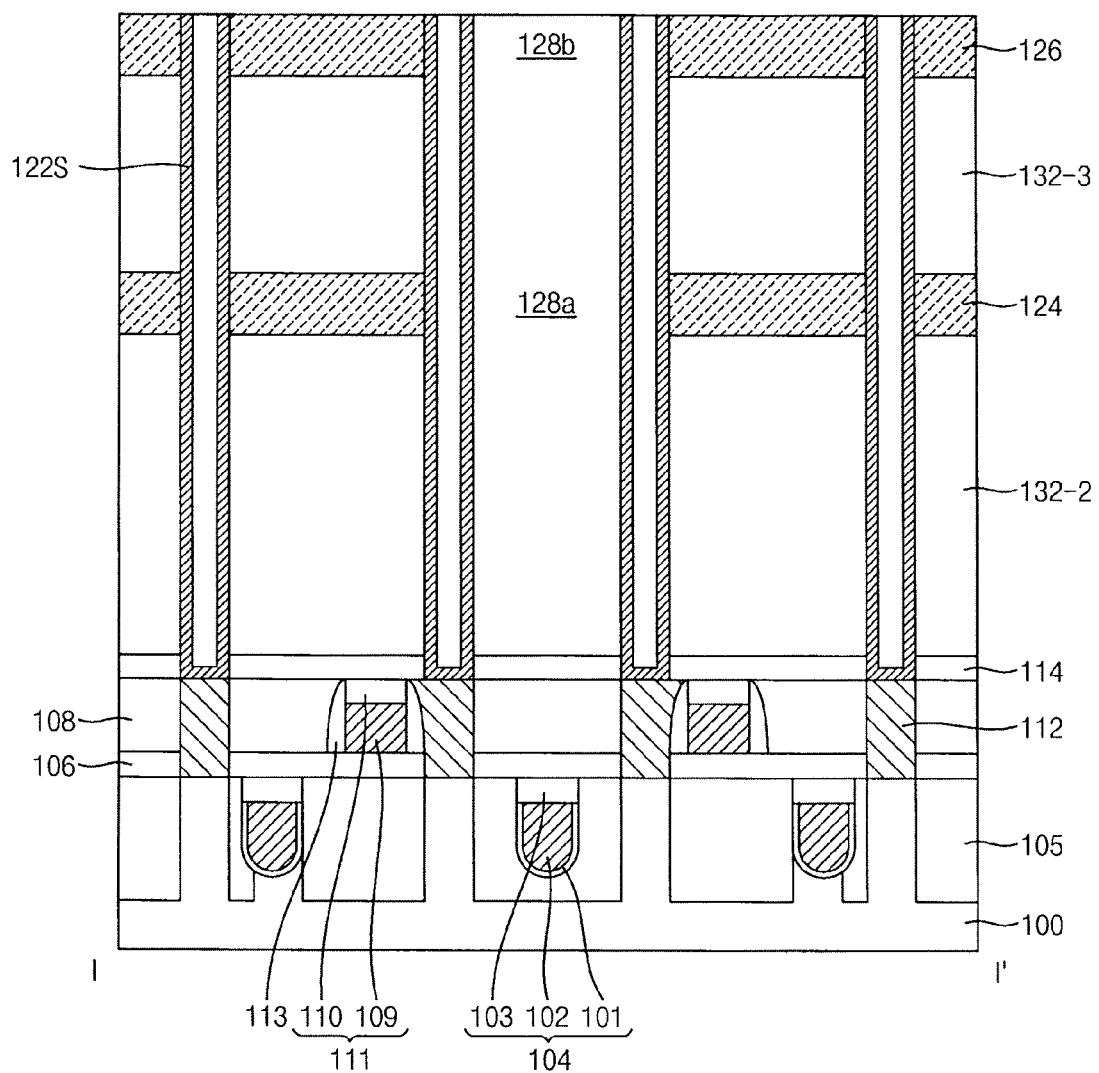

FIGS. 5A and 5B are cross-sectional views illustrating stages of a method of manufacturing a semiconductor device in accordance with an exemplary embodiment. This method may be used for manufacturing the semiconductor device shown in FIG. 2C, FIG. 2D, and/or FIG. 2E. However, the present inventive concept is not limited thereto. Elements of the semiconductor device shown in FIGS. 5A and 5B may be substantially the same as those shown in FIGS. 3A to 3E. Thus, like reference numerals may refer to like elements, and detailed explanations thereon are omitted herein.

Referring to FIG. 5A, a second mask pattern 144 may be formed on the sacrificial layer 132 and the cylindrical lower electrode 122S of the resultant structure of FIG. 3D to expose a top surface of the preliminary support layer pattern 118. The preliminary support layer pattern 118 may be removed using the second mask pattern 144 as an etching mask. However, the cylindrical lower electrode 122S of FIG. 5A may be formed to have a top surface higher than that of the cylindrical lower electrode 122S of FIG. 3D.

Thus, top surfaces of all portions of the sacrificial layer 132 except for a portion of the sacrificial layer 132 having the open area 128 may be exposed. Alternatively, the preliminary support layer pattern 118 may be removed without using the second mask pattern 144.

An upper portion of the exposed sacrificial layer 132 may be removed to form a recess 146, and thus the sacrificial layer 132 may be transformed into a sacrificial layer pattern 132-2. The recess 146 may be formed between neighboring cylindrical lower electrodes 122S except for the open area 128. In an exemplary embodiment, the semiconductor device may also include a pillar-shaped lower electrode 122P (refer to FIG. 2D) instead of the cylindrical lower electrode 122S, as illustrated with reference to FIGS. 3A to 3F.

Referring to FIG. 5B, after removing the second mask pattern 144, a first support pattern 124, an additional sacrificial layer 132-3, and a second support pattern 126 may be sequentially formed in the recess 146. The first support pattern 124 and the second support pattern 126 may have a first open area 128a and a second open area 128b, respectively, which may vertically overlap the open area 128.

The first support pattern 124 may be formed of, e.g., an oxide or a nitride, and the second support pattern 126 may be formed of an insulating material containing oxygen, e.g., silicon oxide and/or silicon oxynitride. The sacrificial layer pattern 132-2 and the additional sacrificial layer 132-3 may be formed of, e.g., spin on hardmask (SOH) and/or undoped polysilicon.

In an exemplary embodiment, the second support pattern 126 may be formed by forming an additional support layer on the additional sacrificial layer 132-3 and planarizing the additional support layer until a top surface of the cylindrical lower electrode 122S is exposed. The planarization process may include a CMP process and/or an etch back process. A top surface of the second support pattern 126 may be formed to be substantially coplanar with a top surface of the cylindrical lower electrode 122S.

A process substantially the same as or similar to that illustrated with reference to FIG. 3F or FIG. 4F may be performed.

For example, after removing the additional sacrificial layer 132-3 and the sacrificial layer pattern 132-2, a dielectric layer 134, a first upper electrode 136, a second upper electrode 138, a third upper electrode 140, and an anti-reflective layer 142 may be sequentially formed on the cylindrical lower electrodes 122S to manufacture the semiconductor device shown in FIG. 2C, FIG. 2D, and/or FIG. 2E.

Figure 6A:
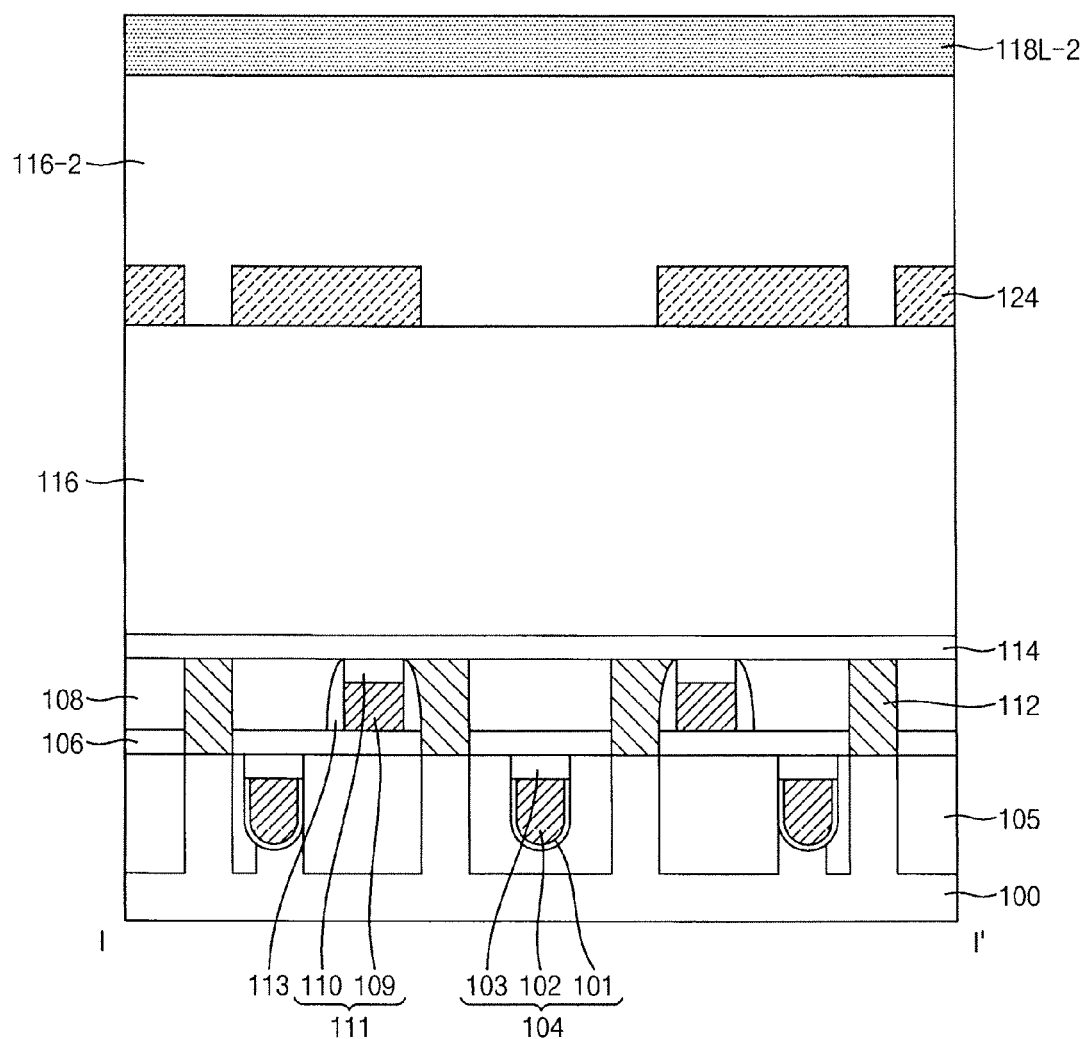
FIGS. 6A and 6B are cross-sectional views illustrating stages of a method of manufacturing a semiconductor device in accordance with an exemplary embodiment.
Figure 6B:
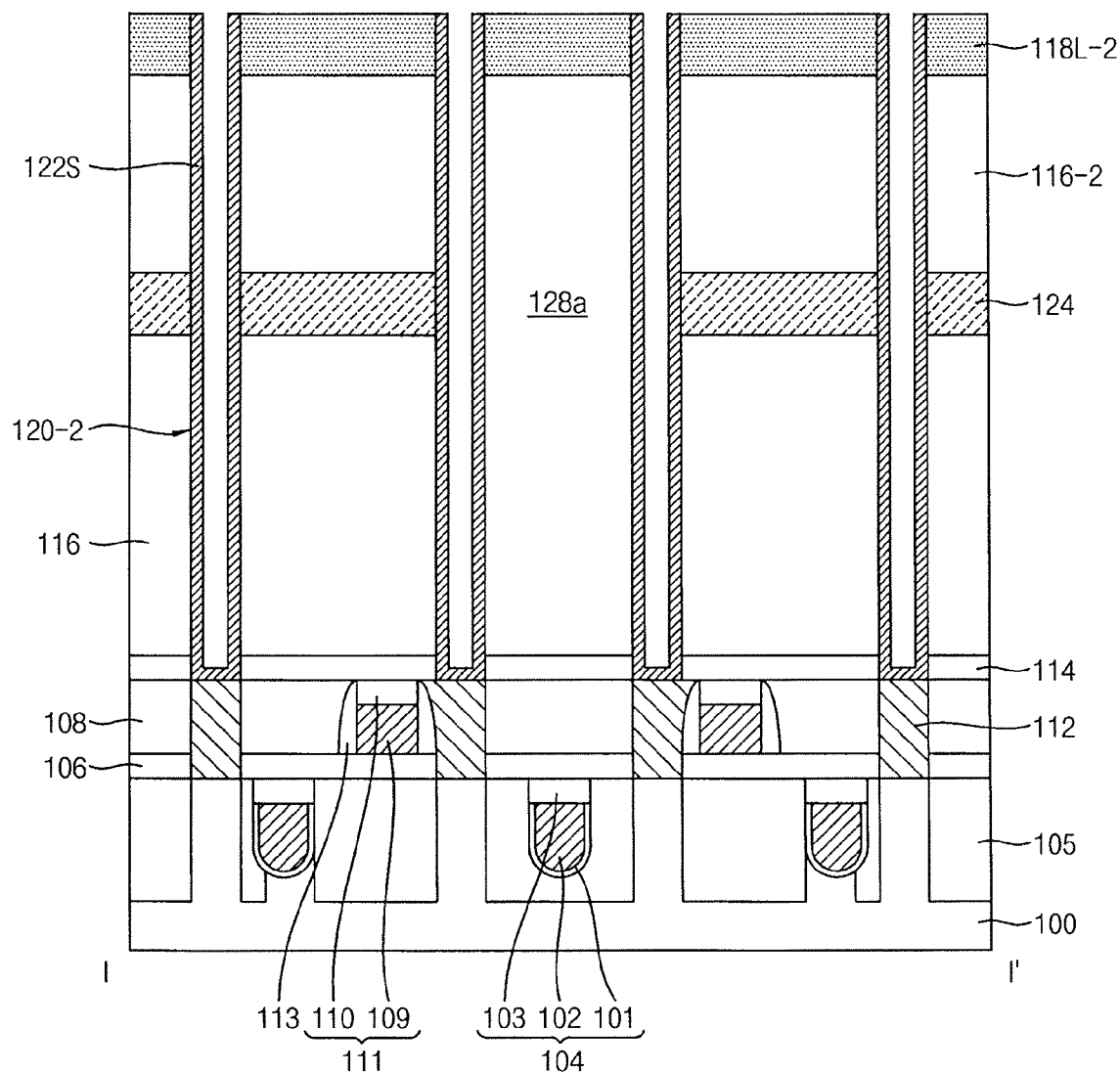

FIGS. 6A and 6B are cross-sectional views illustrating stages of a method of manufacturing a semiconductor device in accordance with an exemplary embodiment. This method may be used for manufacturing the semiconductor device shown in FIG. 2C, FIG. 2D, and/or FIG. 2E. However, the present inventive concept is not limited thereto. In addition, this method may be substantially the same as or similar to the method illustrated with reference to FIGS. 3A to 3F, except that the support pattern may be formed before forming the lower electrode. Thus, like reference numerals may refer to like elements, and detailed explanations thereon are omitted herein.

Referring to FIG. 6A, a process substantially the same as or similar to that illustrated with reference to FIG. 3A may be performed, and thus a gate structure 104 may be formed through a substrate 100 and an isolation layer 105. A cell blocking layer 106, a bit line structure 111, and a spacer 113 may be formed on the substrate 100 and the isolation layer 105. In addition, an insulating interlayer 108 covering the bit line structure 111 and a contact pad 112 penetrating through the insulating interlayer 108 may be formed, and an etch stop layer 114 may be formed on the insulating interlayer 108 and the contact pad 112.

A first mold layer 116, a first support pattern 124, an additional first mold layer 116-2, and an additional preliminary support layer 118L-2 may be sequentially formed on the etch stop layer 114.

Referring to FIG. 6B, the additional preliminary support layer 118L-2, the additional first mold layer 116-2, and the first mold layer 116 may be partially etched to form a plurality of second contact holes 120-2. In an exemplary embodiment, each of the second contact holes 120-2 may be formed through a portion of the additional first mold layer 116-2 between the first support patterns 124 and a portion of the first mold layer 116 thereunder, and the first support pattern 124 may have a first open area 128a therein.

A cylindrical lower electrode 122S may be formed in each of the second contact holes 120-2. Alternatively, a pillar-shaped lower electrode 122P (refer to FIG. 2D) may be formed in each of the second contact holes 120-2.

After the additional preliminary support layer 118L-2 may be replaced with a second support pattern 126, a dielectric layer 134, a first upper electrode 136, a second upper electrode 138, a third upper electrode 140, and an anti-reflective layer 142 may be sequentially formed to manufacture the semiconductor device shown in FIG. 2C, FIG. 2D, and/or FIG. 2E.

The first support pattern 124 may be formed of, e.g., an oxide and/or a nitride, and the second support pattern 126 may be formed of an insulating material containing oxygen, e.g., silicon oxide and/or silicon oxynitride. When the first support pattern 124 includes an oxide, the first mold layer 116 and the additional first mold layer 116-2 may be formed of a semiconductor material, e.g., polysilicon, amorphous silicon, and/or silicon-germanium, etc.

A top surface of the cylindrical lower electrode 122S may be formed to be substantially coplanar with a top surface of the second support pattern 126.

Figure 7A:
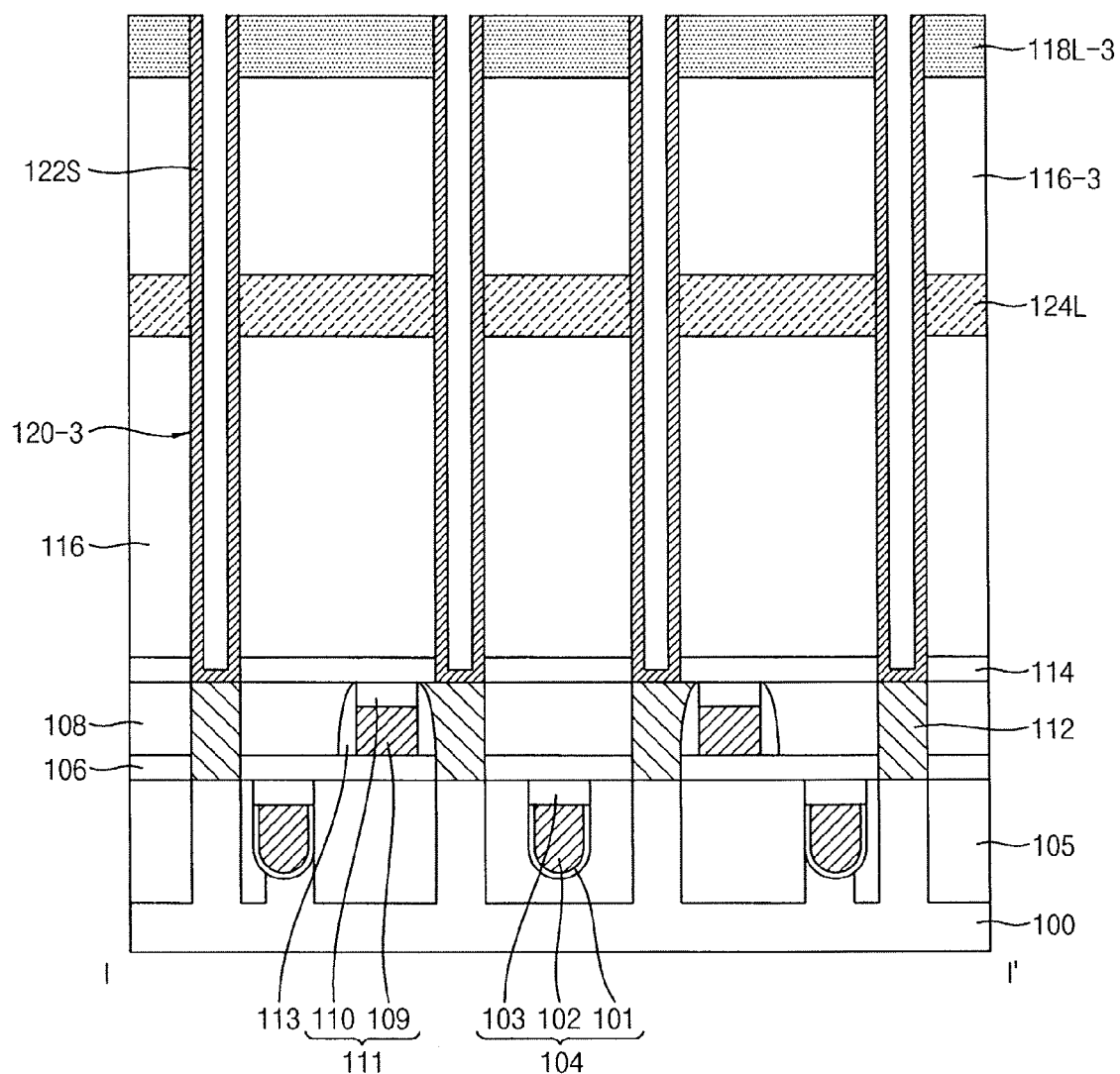
FIGS. 7A, 7B, and 7C are cross-sectional views illustrating stages of a method of manufacturing a semiconductor device in accordance with an exemplary embodiment.
Figure 7B:
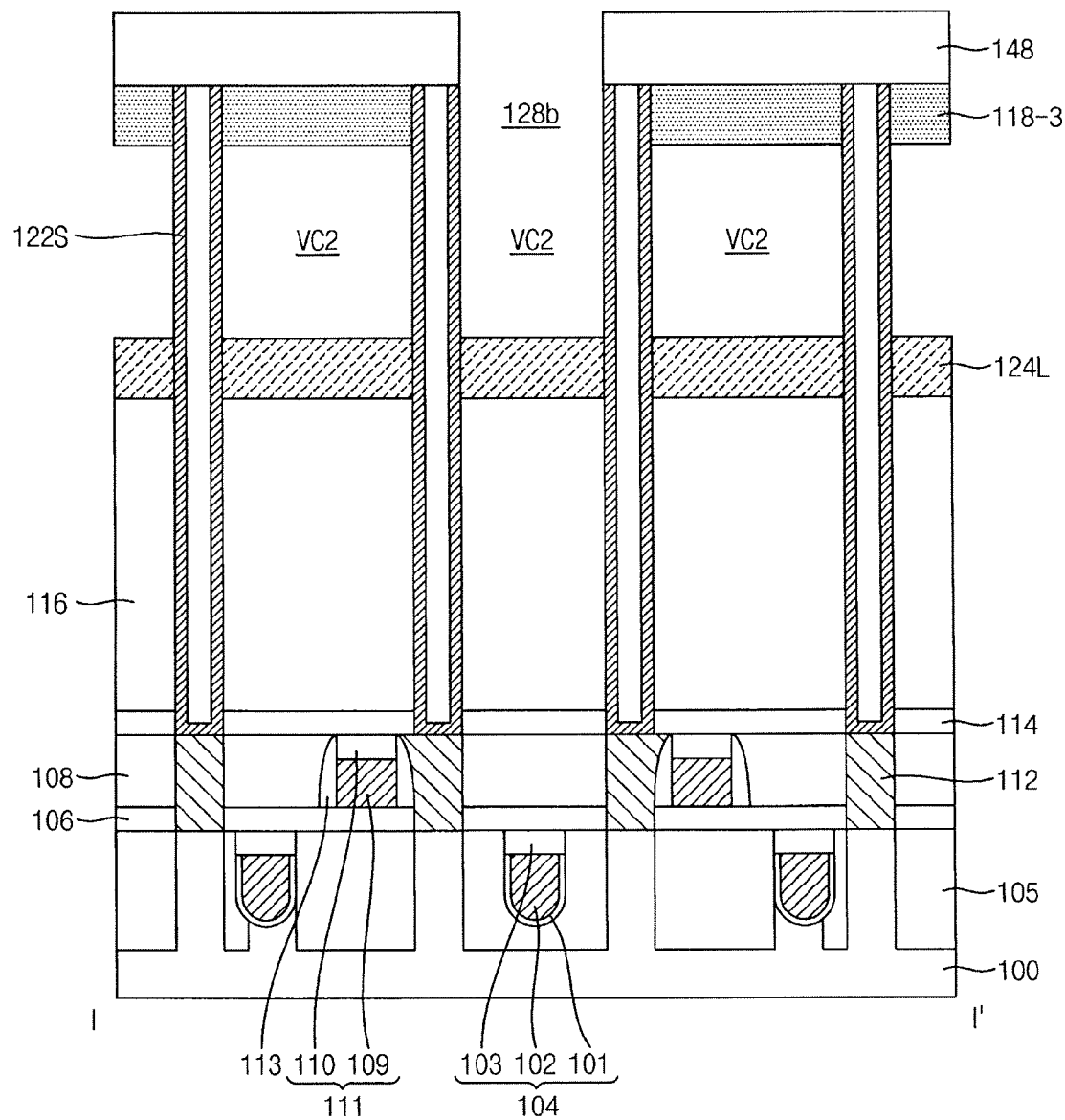
Figure 7C:
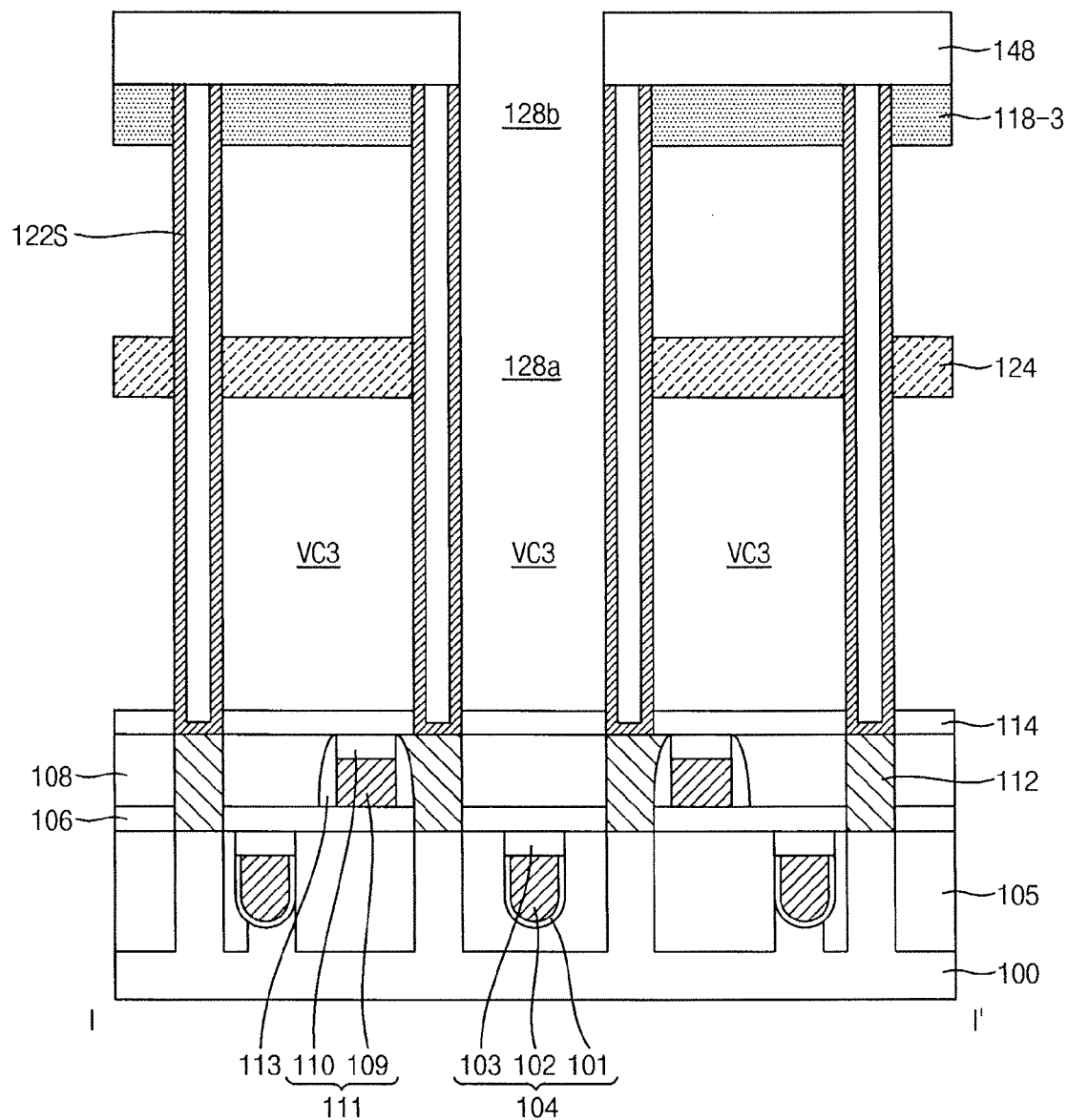

FIGS. 7A, 7B and 7C are cross-sectional views illustrating stages of a method of manufacturing a semiconductor device in accordance with an exemplary embodiment. This method may be used for manufacturing the semiconductor device shown in FIG. 2C, FIG. 2D, and/or FIG. 2E. However, the present inventive concept is not limited thereto. In addition, this method may include processes substantially the same as or similar to those illustrated with reference to FIGS. 3A to 3F. Thus, like reference numerals may refer to like elements, and detailed explanations thereon are omitted herein.

Referring to FIG. 7A, a process substantially the same as or similar to that illustrated with reference to FIG. 6A may be performed, and thus an etch stop layer 114 and underlying structures may be formed on a substrate 100. A first mold layer 116, a first support layer 124L, an additional first mold layer 116-3, and an additional preliminary support layer 118L-3 may be sequentially formed on the etch stop layer 114.

The additional preliminary support layer 118L-3, the additional first mold layer 116-3, the support layer 124L, and the first mold layer 116 may be partially etched to form a plurality of third contact holes 120-3.

A cylindrical lower electrode 122S may be formed in each of the third contact holes 120-3. Alternatively, a pillar-shaped lower electrode 122P (refer to FIG. 2D) may be formed in each of the third contact holes 120-3.

Referring to FIG. 7B, processes substantially the same as or similar to those illustrated with reference to FIGS. 3B and 3C may be performed, and thus a portion of the additional preliminary support layer 118L-3 between the cylindrical lower electrodes 122S may be removed using the third mask pattern 148 as an etching mask. Thus, an additional preliminary support layer pattern 118-3 having a second open area 128b partially exposing a top surface of the additional first mold layer 116-3 may be formed.

The additional first mold layer 116-3 may be removed to form a void VC2 exposing a portion of a surface of each cylindrical lower electrode 122S and a top surface of the support layer 124L.

Referring to FIG. 7C, processes substantially the same as or similar to those illustrated with reference to FIGS. 3B and 3C may be performed, and thus a first support pattern 124 having a first open area 128a may be formed.

The first mold layer 116 may be removed to form a void VC3 exposing the other portions of the surface of each cylindrical lower electrode 122S.

Processes substantially the same as or similar to those illustrated with reference to FIGS. 3D, 3E, and 3F may be performed, and thus the semiconductor device shown in FIG. 2C, FIG. 2D, and/or FIG. 2E may be manufactured.

In an exemplary embodiment, the additional preliminary support layer pattern 118-3 may be replaced with the second support pattern 126 shown in FIGS. 2C to 2E.

The first support pattern 124 may be formed of, e.g., an oxide and/or a nitride, and the second support pattern 126 may be formed of an insulating material containing oxygen, e.g., silicon oxide and/or silicon oxynitride. When the first support pattern 124 includes an oxide, the first mold layer 116 and the additional first mold layer 116-3 may be formed of a semiconductor material, e.g., polysilicon, amorphous silicon, silicon-germanium, etc.

In an exemplary embodiment, a top surface of the cylindrical lower electrode 122S may be formed to be substantially coplanar with a top surface of the second support pattern 126.

Figure 8A:
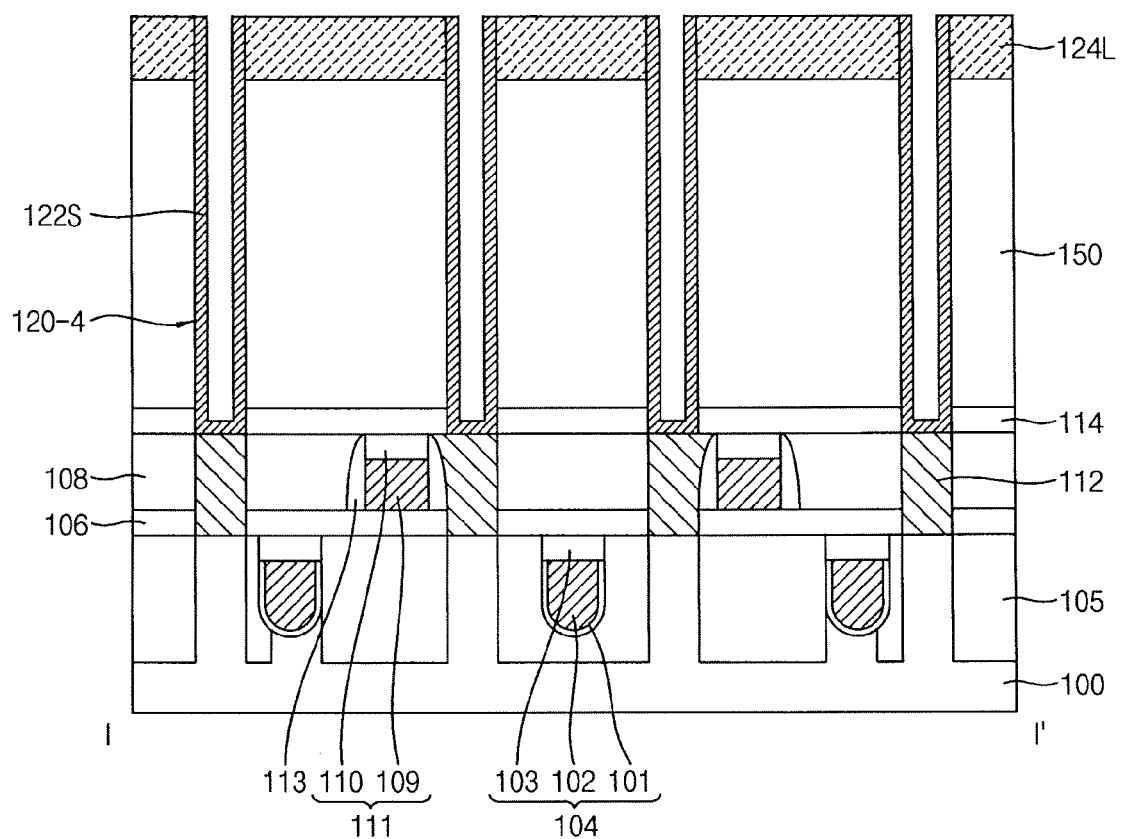
FIGS. 8A, 8B, and 8C are cross-sectional views illustrating stages of a method of manufacturing a semiconductor device in accordance with an exemplary embodiment.
Figure 8B:
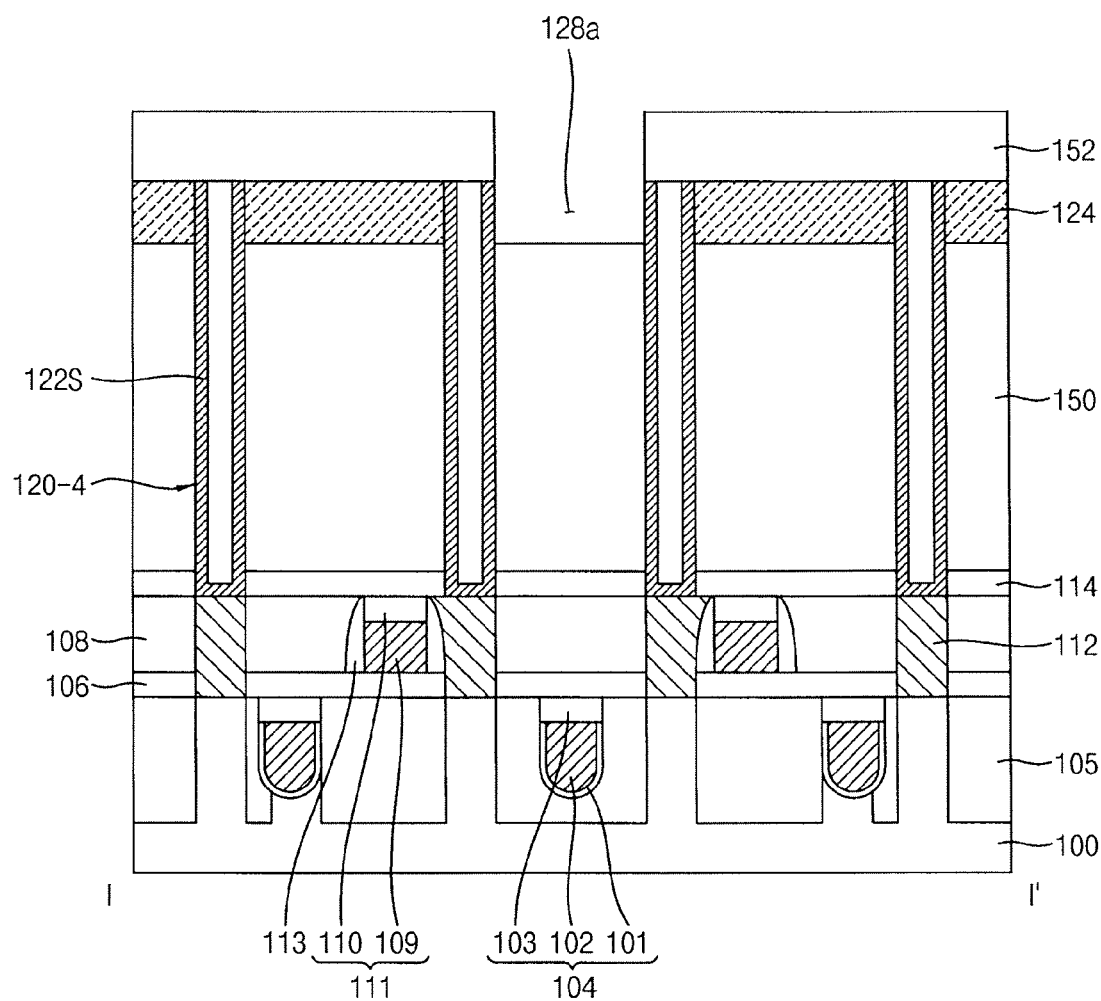
Figure 8C:
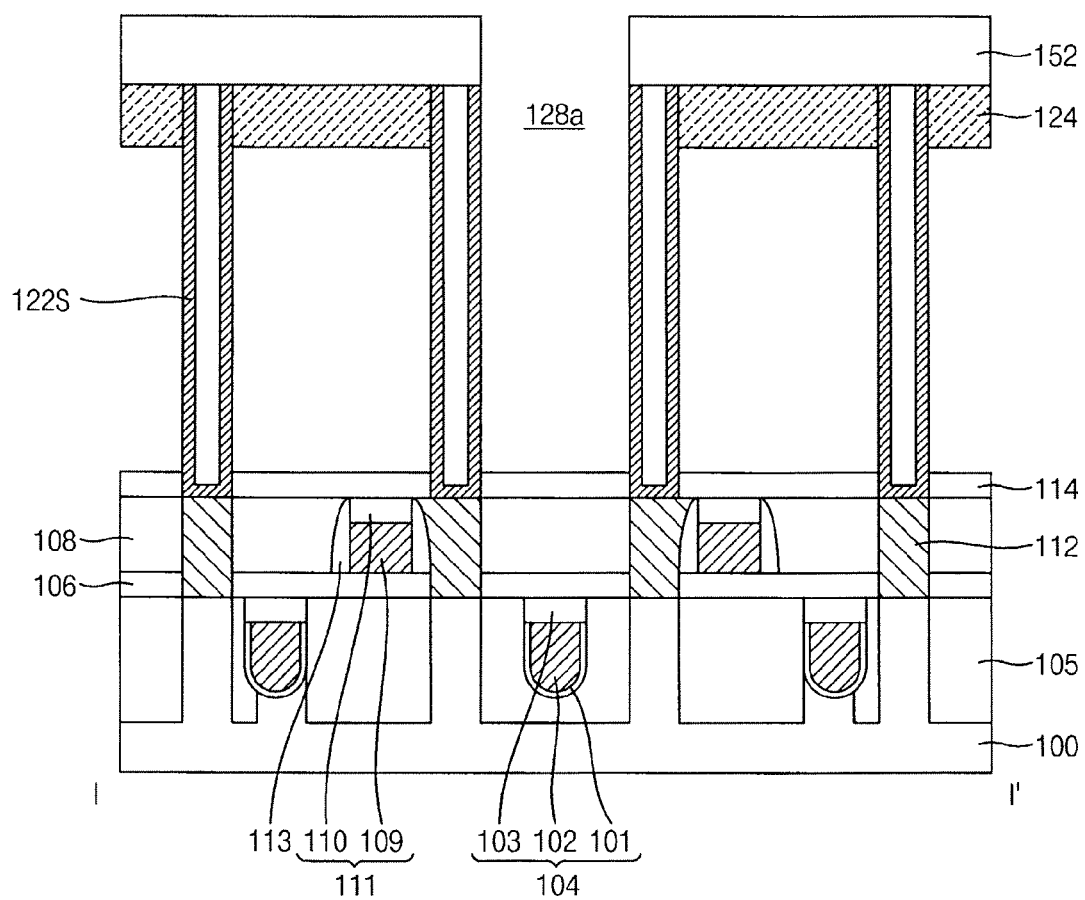

FIGS. 8A, 8B, and 8C are cross-sectional views illustrating stages of a method of manufacturing a semiconductor device in accordance with an exemplary embodiment. This method may be used for manufacturing the semiconductor device shown in FIG. 2A and/or FIG. 2B. However, the present inventive concept is not limited thereto. In addition, this method may include processes substantially the same as or similar to those illustrated with reference to FIGS. 3A to 3F. Thus, like reference numerals may refer to like elements, and detailed explanations thereon are omitted herein.

Referring to FIG. 8A, a process substantially the same as or similar to that illustrated with reference to FIG. 6A may be performed, and thus an etch stop layer 114 and underlying structures may be formed on a substrate 100. A second mold layer 150 and a support layer 124L may be sequentially formed on the etch stop layer 114. In an exemplary embodiment, the second mold layer 150 may be formed of spin on hardmask (SOH), and the support layer 124L may be formed of an insulating material containing oxygen, e.g., silicon oxide and/or silicon nitride.

The support layer 124L, the second mold layer 150, and the etch stop layer 114 may be partially etched to form a plurality of fourth contact holes 120-4 exposing at least a portion of the contact pad 112.

A cylindrical lower electrode 122S may be formed in each of the fourth contact holes 120-4. However, the present inventive concept is not limited thereto, and a pillar-shaped lower electrode 122P (refer to FIG. 2B) may be formed in each of the fourth contact holes 120-4.

In an exemplary embodiment, the cylindrical lower electrode 122S may be formed of doped polysilicon. However, the present inventive concept is not limited thereto, and when the second mold layer 150 includes undoped polysilicon, the cylindrical lower electrode 122S may be formed of a metal.

Referring to FIG. 8B, a portion of the support layer 124L between the cylindrical lower electrodes 122S may be removed using the fourth mask pattern 152 as an etching mask to expose at least a portion of a top surface of the second mold layer 150. Thus, a first support pattern 124 having a first open area 128a may be formed.

Referring to FIG. 8C, a second mold layer 150 may be removed through the first open area 128a to expose a surface of each of the cylindrical lower electrodes 122S.

The first mold layer 116 may be removed to form a void VC3 exposing the other portions of the surface of each cylindrical lower electrode 122S.

A dielectric layer 134, a first upper electrode 136, a second upper electrode 138, a third upper electrode 140, and an anti-reflective layer 142 may be sequentially formed on the cylindrical lower electrodes 122S to manufacture the semiconductor device shown in FIG. 2A and/or FIG. 2B.

In the above method of manufacturing the semiconductor device, the first support pattern 124 may be formed of an insulating material, e.g., silicon oxide and/or silicon nitride, the second mold layer 150 may be formed of, e.g., spin on hardmask (SOH), and the cylindrical lower electrodes 122S may be formed of, e.g., doped polysilicon.

Figure 9:
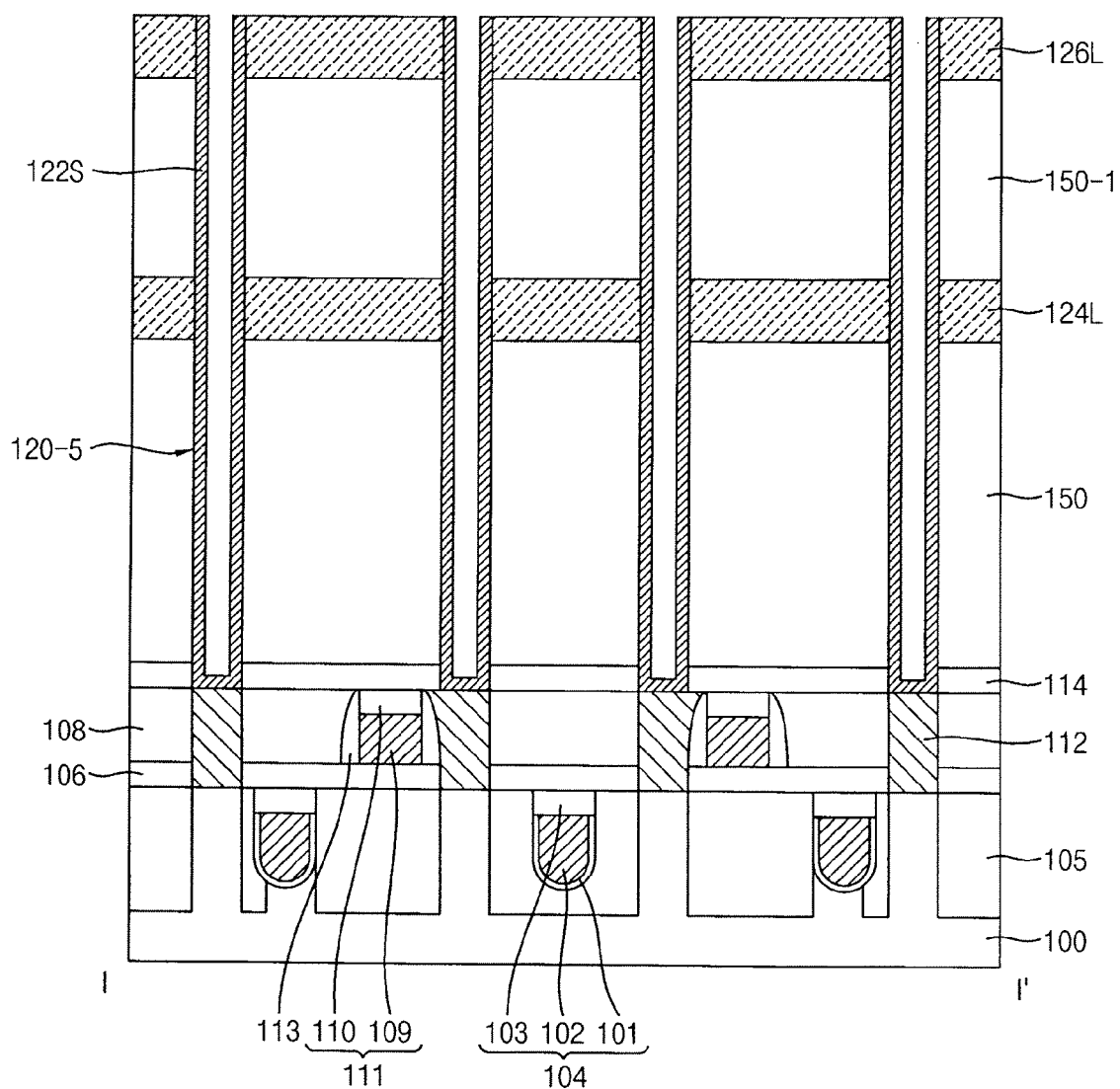
FIG. 9 is a cross-sectional view illustrating stages of a method of manufacturing a semiconductor device in accordance with an exemplary embodiment.

FIG. 9 is a cross-sectional view illustrating stages of a method of manufacturing a semiconductor device in accordance with an exemplary embodiment. This method may be used for manufacturing the semiconductor device shown in FIG. 2C, FIG. 2D, and/or FIG. 2E. However, the present inventive concept is not limited thereto. In addition, this method may include processes substantially the same as or similar to those illustrated with reference to FIGS. 3A to 3F. Thus, like reference numerals may refer to like elements, and detailed explanations thereon are omitted herein.

Referring to FIG. 9, a process substantially the same as or similar to that illustrated with reference to FIG. 6A or FIG. 8A may be performed, and thus an etch stop layer 114 and underlying structures may be formed on a substrate 100. A second mold layer 150, a support layer 124L, an additional second mold layer 150-1, and an additional support layer 126L may be sequentially formed on the etch stop layer 114. In an exemplary embodiment, the second mold layer 150 may be formed of spin on hardmask (SOH), and the support layer 124L may be formed of an insulating material containing oxygen, e.g., silicon oxide and/or silicon nitride.

The additional support layer 126L, the additional second mold layer 150-1, the support layer 124L, the second mold layer 150, and the etch stop layer 114 may be partially etched to form a plurality of fifth contact holes 120-5 exposing at least a portion of the contact pad 112.

A cylindrical lower electrode 122S may be formed in each of the fifth contact holes 120-5. However, the present inventive concept is not limited thereto, and a pillar-shaped lower electrode 122P (refer to FIG. 2B) may be formed in each of the fifth contact holes 120-5. In an exemplary embodiment, the cylindrical lower electrode 122S may be formed of doped polysilicon. However, the present inventive concept is not limited thereto, and when the second mold layer 150 and the additional second mold layer 150-1 include undoped polysilicon, the cylindrical lower electrode 122S may be formed of a metal.

Processes substantially the same as or similar to those illustrated with reference to FIGS. 8B and 8C may be performed to manufacture the semiconductor device in FIG. 2C, FIG. 2D, and/or FIG. 2E.

The semiconductor device may be mounted on various types of semiconductor packages. The semiconductor device and the semiconductor package including the semiconductor device may be applied to various types of systems, e.g., computing systems.

Figure 10:
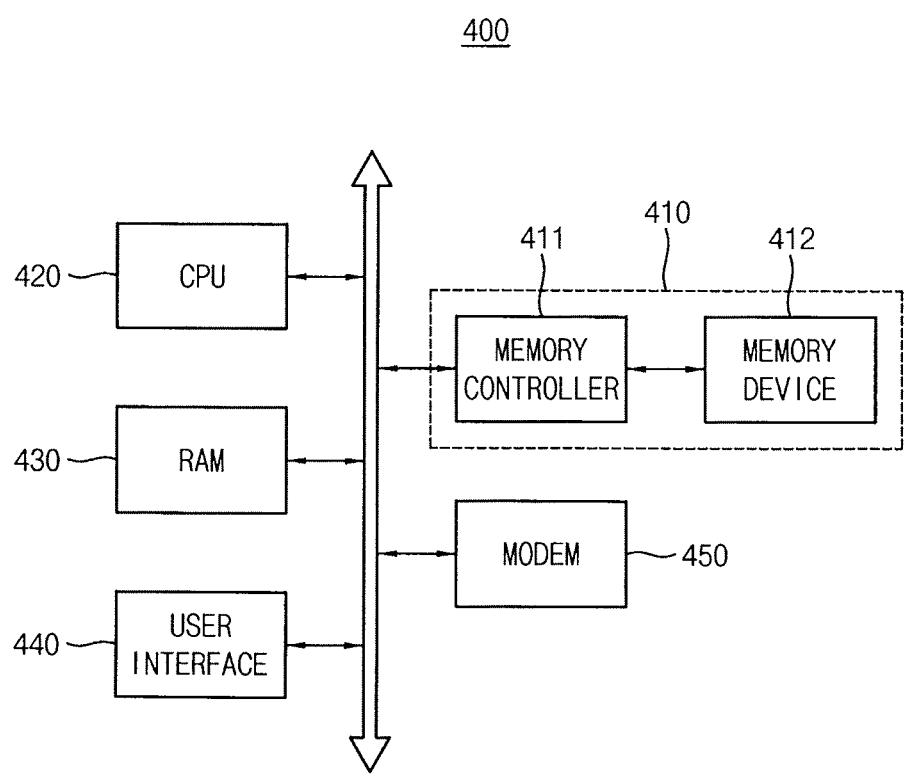
FIG. 10 is a block diagram illustrating a schematic construction of a computing system in accordance with an exemplary embodiment.

FIG. 10 is a block diagram illustrating a schematic construction of a computing system in accordance with an exemplary embodiment.

Referring to FIG. 10, a computing system 400 may include a micro processor or a central processing unit (CPU) 420, a random access memory (RAM) 430, a user interface 440, a modem 450 (e.g., a baseband chipset), and a memory system 410. The memory system 410 may include a memory device 412 and a memory controller 411. The memory device 412 may include the semiconductor device or the DRAM device in accordance with an exemplary embodiment. The memory controller 411 may control the memory device 412. The memory system 410 may be provided to a memory card or a solid state disc (SSD) by the operation of the memory device 412 and the memory controller 411. When the computing system 300 is a mobile device, a battery may be further provided to supply an operation voltage of the computing system 400.

As illustrated above, the semiconductor device in accordance with an exemplary embodiment may have a capacitor having enhanced leakage characteristics and increased capacitance. The semiconductor device may be applied to various types of memory devices.

The foregoing is illustrative of exemplary embodiments and the present inventive concept should not to be construed as limited to the exemplary embodiments thereof. Although a few exemplary embodiments have been described, those skilled in the art will readily appreciate that many modifications are possible in the exemplary embodiments without materially departing from the spirit and scopes of the present inventive concept. Accordingly, all such modifications are intended to be included within the scope of the present inventive concept as defined in the claims.

What is claimed is:

1. A method of manufacturing a semiconductor device, the method comprising:
   sequentially forming a mold layer and a preliminary support layer on a substrate;
   forming a plurality of lower electrodes through the preliminary support layer and the mold layer;
   removing a portion of the preliminary support layer between the plurality of lower electrodes to form a preliminary support layer pattern having an open area exposing a top surface of the mold layer;
   removing the mold layer to form a void between the substrate and the preliminary support layer pattern;
   filling the open area and the void with a sacrificial layer; and
   replacing the preliminary support layer pattern with a support pattern.

2. The method of claim 1, wherein replacing the preliminary support layer pattern with the support pattern includes:
   removing the preliminary support layer pattern to expose a top surface of the sacrificial layer;
   forming a support layer on the exposed top surface of the sacrificial layer; and
   planarizing the support layer until a top surface of the lower electrode is exposed to form the support pattern on the exposed top surface of the sacrificial layer.

3. The method of claim 1, further comprising:
   removing the sacrificial layer to expose the plurality of lower electrodes; and
   sequentially forming a dielectric layer and an upper electrode on the plurality of lower electrodes.

4. The method of claim 1, wherein top surfaces of the lower electrodes are formed to be substantially coplanar with a top surface of the support pattern.

5. The method of claim 1, wherein the support pattern includes a first material different from that of the preliminary support layer pattern, and the first material includes an oxide.

6. The method of claim 1, wherein the mold layer includes a semiconductor oxide, polysilicon, amorphous silicon, silicon-germanium or a combination thereof, and
   wherein the sacrificial layer includes spin on hardmask (SOH) and/or polysilicon.

7. The method of claim 1, wherein each of the plurality of lower electrodes is formed to have a cylindrical shape and/or a pillar shape.

8. The method of claim 1, wherein replacing the preliminary support layer pattern with the support pattern includes:
   removing the preliminary support layer pattern to expose a portion of the sacrificial layer;
   partially removing the exposed portion of the sacrificial layer to form a recess; and
   sequentially forming a first support pattern, an additional sacrificial layer, and a second support pattern in the recess.

9. The method of claim 8, wherein the first support pattern includes an oxide and/or a nitride, and wherein the second support pattern includes an oxide.

10. The method of claim 1, further comprising:
   sequentially forming an additional mold layer and an additional preliminary support layer on the support pattern and the sacrificial layer;
   forming a plurality of additional lower electrodes through the additional preliminary support layer and the additional mold layer to contact the plurality of lower electrodes, respectively;
   removing a portion of the additional preliminary support layer between the plurality of additional lower electrodes to form an additional preliminary support layer pattern having an additional open area exposing a top surface of the additional mold layer;
   removing the additional mold layer to form an additional void between the support pattern and the additional preliminary support layer pattern;
   filling the additional open area and the additional void with an additional sacrificial layer;
   replacing the additional preliminary support layer pattern with an additional support pattern;
   removing the sacrificial layer and the additional sacrificial layer to expose the plurality of lower electrodes and the plurality of additional lower electrodes; and
   sequentially forming a dielectric layer and an upper electrode on the plurality of lower electrodes and the plurality of additional lower electrodes.

11. The method of claim 10, wherein each of the plurality of lower electrodes is formed to have a cylindrical shape or a pillar shape, and wherein each of the plurality of additional lower electrodes is formed to have a cylindrical shape or a pillar shape.

12. The method of claim 10, wherein the support pattern includes an oxide and/or a nitride, and wherein the additional support pattern includes a first material different from that of the preliminary support layer pattern, and the first material includes an oxide.

13. The method of claim 10, wherein top surfaces of the additional lower electrodes are formed to be substantially coplanar with a top surface of the additional support pattern.

14. The method of claim 10, wherein the additional mold layer includes a semiconductor oxide, polysilicon, amorphous silicon, silicon-germanium or a combination thereof, and
wherein the additional sacrificial layer includes spin on hardmask (SOH) and/or polysilicon.

15. The method of claim 1, further comprising forming an additional support pattern between the substrate and the support pattern.

16. The method of claim 15, wherein the support pattern includes an oxide, and the additional support pattern includes an oxide and/or a nitride, and
wherein top surfaces of the lower electrodes are formed to be substantially coplanar with a top surface of the support pattern.

17. A method of manufacturing a semiconductor device, the method comprising:
forming a plurality of electrode structures on a substrate, each of the electrode structures extending in a first direction substantially perpendicular to a top surface of the substrate; and
forming a support pattern structure between the plurality of electrode structures, the support pattern structure including a first support pattern and a second support pattern, the support pattern structure contacting at least a portion of each of the electrode structures,
wherein the first support pattern is apart by a first distance from the top surface of the substrate in the first direction, and the second support pattern is apart by a second distance from the top surface of the substrate in the first direction, the second distance being greater than the first distance,
wherein the second support pattern includes an oxide,
wherein the second support pattern has a top surface substantially coplanar with at least one of the electrode structures,
wherein a length of a portion of the first support pattern between neighboring electrode structures is greater than that of a portion of the second support pattern between the neighboring electrode structures, and
wherein a width of an upper portion of each of the electrode structures is greater than that of a lower portion of each of the electrode structures.

18. The method of claim 17, wherein each of the plurality of electrode structures is formed to have a cylindrical shape, a pillar shape, or a combination shape of the cylindrical shape and the pillar shape.

19. The method of claim 17, wherein forming the plurality of electrode structures includes forming first and second electrode structures at third and fourth distances, respectively, from the top surface of the substrate in the first direction, the fourth distance being greater than the third distance, and the second electrode structure contacting at least a portion of a top surface of the first electrode structure,
wherein a top surface of the first support pattern is substantially coplanar with that of the first electrode structure, and a top surface of the second support pattern is substantially coplanar with that of the second electrode structure, and
wherein the first electrode structure has a pillar shape, and the second electrode structure has a cylindrical shape.

* * * * *